United States Patent
Miyoshi et al.

(10) Patent No.: US 9,635,467 B2
(45) Date of Patent: Apr. 25, 2017

(54) ELECTROACOUSTIC CONVERTER FILM

(71) Applicant: FUJIFILM Corporation, Tokyo (JP)

(72) Inventors: Tetsu Miyoshi, Ashigara-kami-gun (JP); Yusuke Hatanaka, Ashigara-kami-gun (JP); Akito Fukunaga, Ashigara-kami-gun (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 14/858,734

(22) Filed: Sep. 18, 2015

(65) Prior Publication Data

US 2016/0014527 A1    Jan. 14, 2016

Related U.S. Application Data

(63) Continuation of application No. PCT/JP2014/057893, filed on Mar. 20, 2014.

(30) Foreign Application Priority Data

Mar. 29, 2013  (JP) .................................. 2013-074481

(51) Int. Cl.
*H04R 25/00*  (2006.01)
*H04R 17/00*  (2006.01)
*H01L 41/18*  (2006.01)
*B06B 1/06*  (2006.01)
(Continued)

(52) U.S. Cl.
CPC ......... *H04R 17/005* (2013.01); *B06B 1/0662* (2013.01); *B06B 1/0688* (2013.01); *G10K 11/004* (2013.01); *H01L 41/183* (2013.01); *H04R 17/025* (2013.01); *H04R 2400/00* (2013.01); *H04R 2499/11* (2013.01)

(58) Field of Classification Search
CPC ................ H04R 17/005; H04R 17/025; H04R 2499/11; H04R 2400/00; G10K 11/004; B06B 1/0662; B06B 1/0688; H01L 41/183
See application file for complete search history.

(56) References Cited

U.S. PATENT DOCUMENTS

2013/0256581 A1  10/2013  Miyoshi et al.

FOREIGN PATENT DOCUMENTS

| JP | 61-191698 U | 11/1986 |
|---|---|---|
| JP | 62-167498 U | 10/1987 |
| JP | 8-33097 A | 2/1996 |

(Continued)

OTHER PUBLICATIONS

International Search Report, issued in PCT/JP2014/057893, dated Jun. 3, 2014.

(Continued)

*Primary Examiner* — Tuan D Nguyen
(74) *Attorney, Agent, or Firm* — Birch, Stewart, Kolasch & Birch, LLP

(57) ABSTRACT

Provided is an electroacoustic converter film including thin film electrodes provided on both surfaces of a polymeric composite piezoelectric body in which piezoelectric body particles are dispersed in a viscoelastic matrix formed of a polymer material that exhibits viscoelasticity at normal temperature, and protective layers formed on the thin film electrodes. The electroacoustic converter film further includes electrode lead-out metal foils laminated on the thin film electrodes, and the electrode lead-out metal foils allows connection to wiring through soldering when electrodes are led out from the thin film electrodes.

17 Claims, 14 Drawing Sheets

(51) Int. Cl.
G10K 11/00 (2006.01)
H04R 17/02 (2006.01)

(56) References Cited

FOREIGN PATENT DOCUMENTS

| | | |
|---|---|---|
| JP | 2000-338901 A | 12/2000 |
| JP | 2008-294493 A | 12/2008 |
| JP | 2012-95193 A | 5/2012 |
| JP | 2012-142546 A | 7/2012 |
| JP | 2012-184441 A | 9/2012 |
| WO | WO 2006/025138 A1 | 3/2006 |

OTHER PUBLICATIONS

Kitayama, "1971 General National Conference of the Institute of Electronics, Information and Communication Engineers", 366 Piezoelectric characteristics of polymer-ceramic composite.
Shirai et al., "A Microphone for Telephone Using Composite Piezoelectric Polymer", Research Report of the Institute of Electronics, Information and Communication Engineers, 24, 15, Jul. 29, 1980, pp. 15-22.
Japanese Office Action, issued Jan. 26, 2016, for Japanese Application No. 2014-054574, along with an English machine translation.
International Preliminary Report on Patentability and Written Opinion of the International Searching Authority (Forms PCT/IB/338, PCT/IB/373 and PCT/ISA/237) dated Oct. 8, 2015, for International Application No. PCT/JP2014/057893.

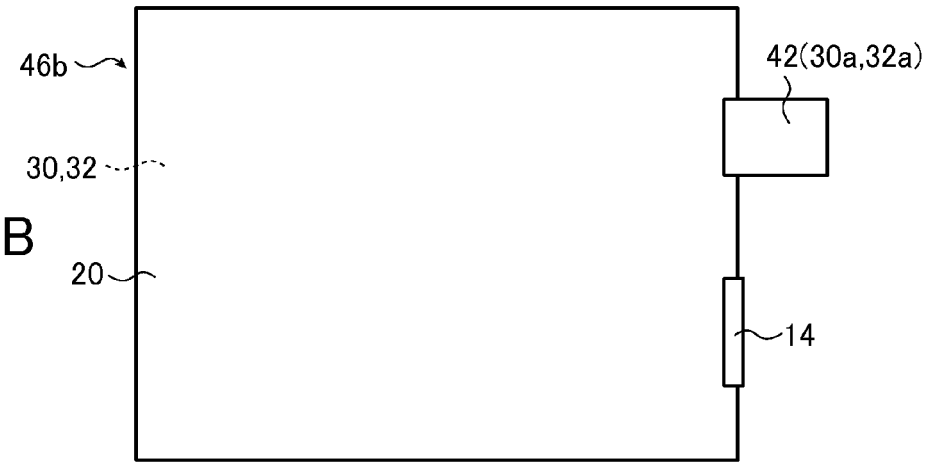
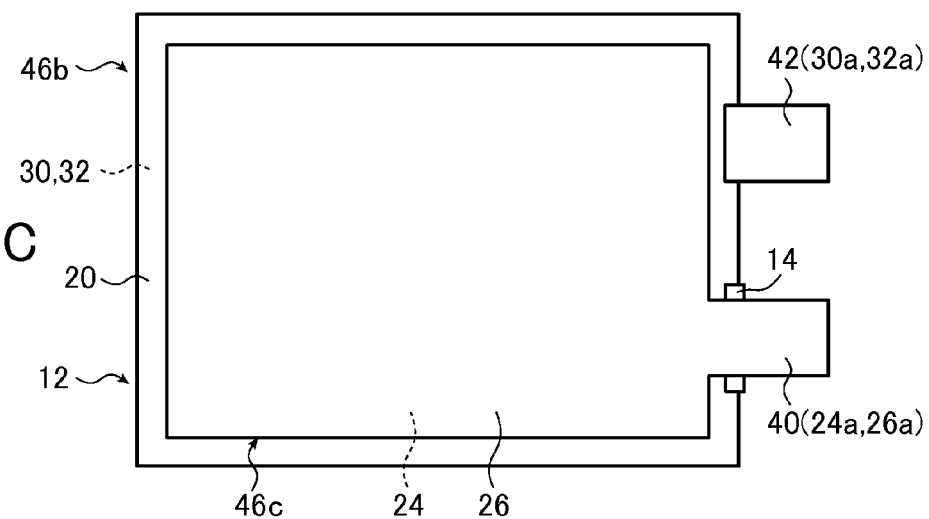

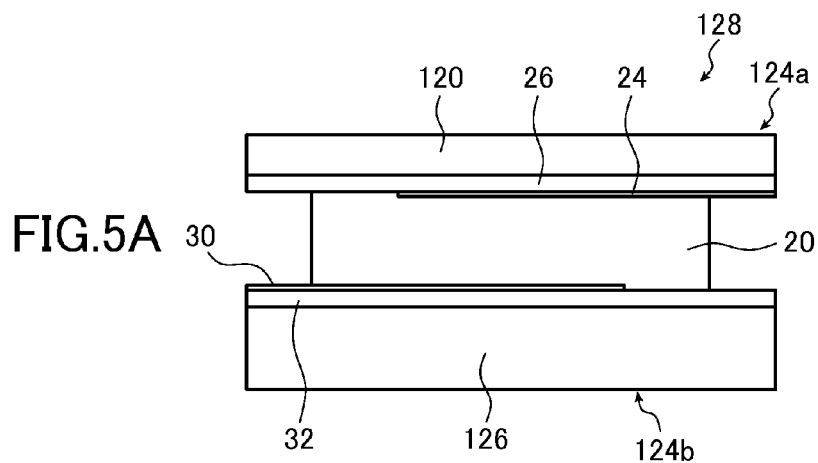
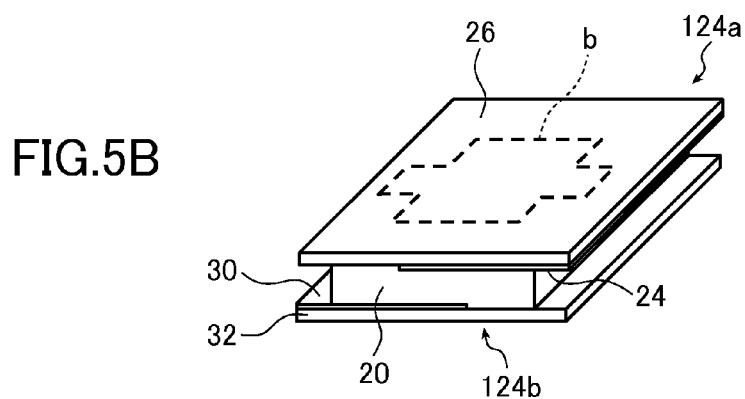
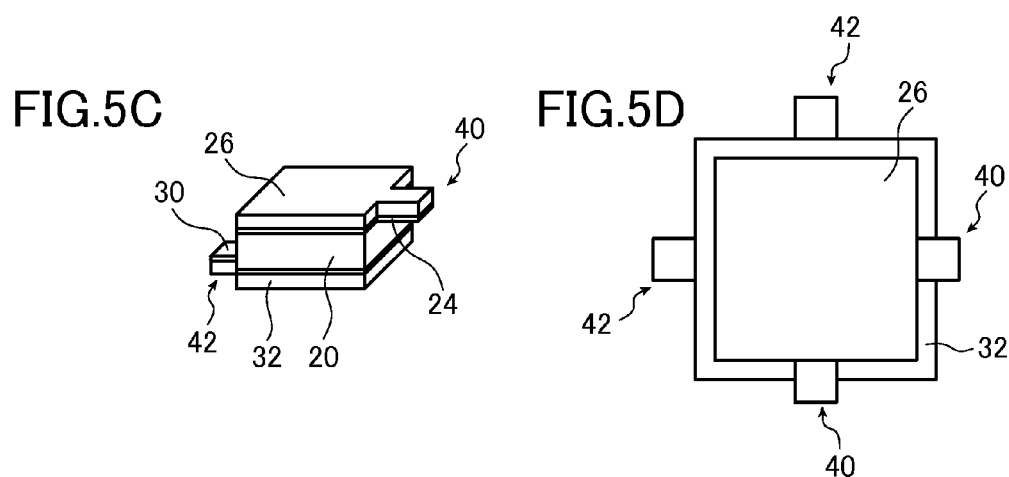

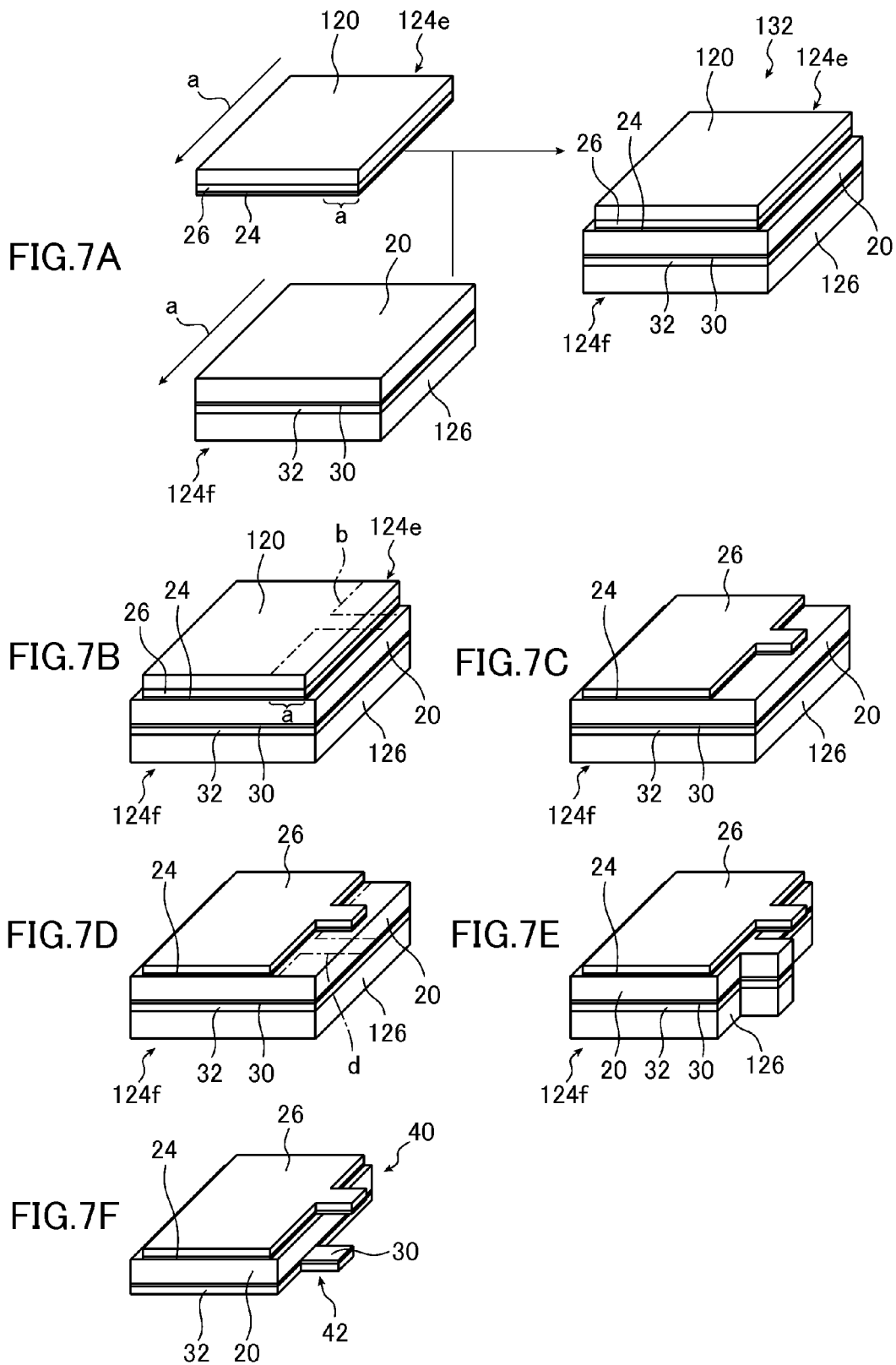

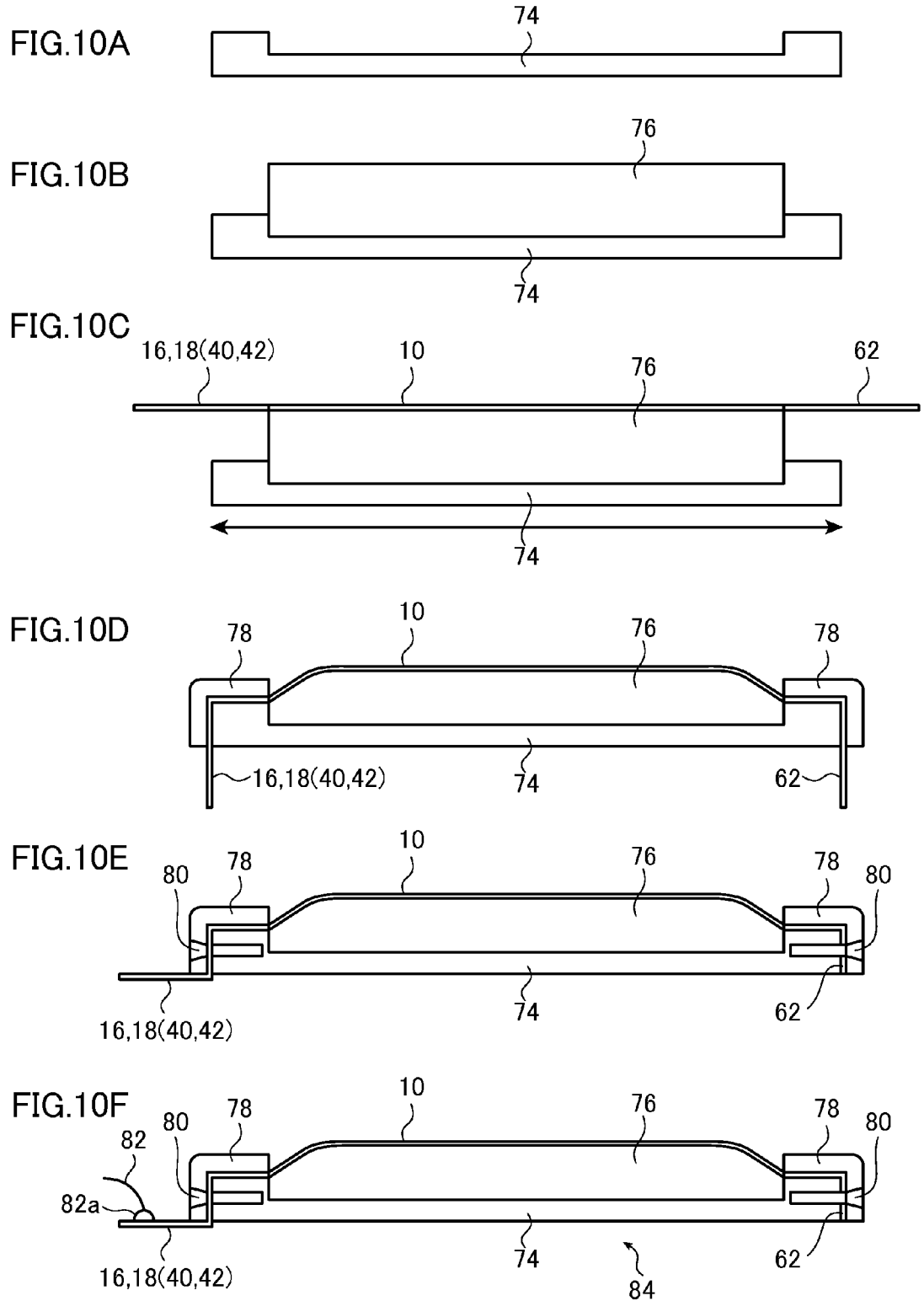

ELECTROACOUSTIC CONVERTER FILM

CROSS-REFERENCE TO RELATED APPLICATIONS

This application is a Continuation of PCT International Application No. PCT/JP2014/057893 filed on Mar. 20, 2014, which claims priority under 35 U.S.C. §119(a) to Japanese Patent Application No. 2013-074481 filed on Mar. 29, 2013. The above application is hereby expressly incorporated by reference, in its entirety, into the present application.

BACKGROUND OF THE INVENTION

The present invention relates to an electroacoustic converter film used for, for example, an acoustic device such as a speaker or a microphone. More particularly, the present invention relates to an electroacoustic converter film in which leading out of wiring can be performed easily and reliably at the time of mounting the electroacoustic converter film as the speaker or the like.

In recent years, the research related to flexible displays using a flexible substrate such as plastic has been progressing.

As a substrate of such flexible displays, for example, JP 2000-338901 A discloses a flexible display substrate obtained by laminating a gas barrier layer or a transparent conductive layer on a transparent plastic film.

The flexible displays are superior to the conventional displays using a glass substrate in terms of the lightweightness, slimness, flexibility, and the like, and can be placed on a curved surface of a column and the like. Moreover, since flexible displays can be stored in a state of rolled, portability thereof does not deteriorate even the screen size thereof is large. Therefore, flexible displays are drawing attention for usage in apparatuses for displaying advertisement and the like or for usage in display apparatuses such as a personal digital assistance (PDA).

When these flexible displays are used as an image display apparatus-cum-sound generation apparatus such as a television receiver that reproduces images with sound, a speaker which is an acoustic apparatus for generating sound is required.

Regarding the shape of conventional speakers, generally, there are so-called cone-type speakers having a funnel shape, dome-type speakers having a spherical shape, and the like. However, if these speakers are built in the aforementioned flexible displays, lightweightness or flexibility which is an advantage of the flexible displays may be impaired. Moreover, if the speakers are installed externally, it is inconvenient to carry the displays, it is difficult to install the displays to a curved wall, and the external appearance may not be aesthetically pleasing.

Under these circumstances, for example, JP 2008-294493 A discloses that as a speaker, which can be integrated with a flexible display without impairing the lightweightness or flexibility, a sheet-like piezoelectric film having flexibility can be adopted.

The piezoelectric film is obtained by performing polarization processing on a uniaxially stretched polyvinylidene fluoride (PVDF) film at a high voltage, and has a property of expanding and contracting in response to an applied voltage.

In order to adopt the piezoelectric film as a speaker, the expansion and contraction movement performed along the film surface need to be converted into vibration of the film surface. The expansion and contraction movement can be converted into vibration by holding the piezoelectric film in a state of curved, and in this manner, the piezoelectric film can be caused to function as a speaker.

Incidentally, it is well known that a lowest resonance frequency $f_0$ of a speaker diaphragm is calculated by the following equation. In the equation, s is stiffness of a vibration system, and m is a mass.

Lowest Resonance Frequency:

$$f_0 = \frac{1}{2\pi}\sqrt{\frac{s}{m}}$$

At this time, as a degree of bending of the piezoelectric film, that is, as a radius of curvature of a bending portion increases, the mechanical stiffness s decreases, hence the lowest resonance frequency $f_0$ is reduced. That is, the sound quality (volume and frequency characteristics) of the speaker varies with the radius of curvature of the piezoelectric film.

In order to solve the above problem, in JP 2008-294493 A, the speaker has a sensor for measuring a degree of bending of the piezoelectric film, and according to the degree of bending of the piezoelectric film, sound quality is corrected by means of increasing or decreasing the amplitude by a predetermined amount for each frequency band of the audio signals, whereby stabilized sound can be output.

When a flexible display, which is integrated with a speaker formed of a piezoelectric film and has a rectangular shape in a plan view, is gripped in a state of gently bent just like documents such as newspaper or a magazine as a portable apparatus and is used in a state where the length and breadth has been switched for screen display, it is preferable for the image display surface to be able to bend not only in the longitudinal direction but also in the horizontal direction.

However, since the piezoelectric film formed of uniaxially stretched PVDF has in-plane anisotropy as the piezoelectric characteristic, the sound quality varies significantly with the bending direction even if the curvature is the same.

In addition, since loss tangent of PVDF is smaller than that of the ordinary speaker diaphragm such as cone paper, resonance thereof easily becomes strong, and frequency characteristics thereof shows great fluctuation of frequency. Accordingly, when the lowest resonance frequency $f_0$ varies with the change in the curvature, the sound quality also changes to a large extent.

As described above, due to the problems intrinsic to PVDF, it is difficult for the sound quality correction means disclosed in the aforementioned JP 2008-294493 A to reproduce stabilized sound.

Meanwhile, as an example of sheet-like flexible piezoelectric materials which do not have in-plane anisotropy as a piezoelectric characteristic, there is a polymeric composite piezoelectric body obtained by dispersing a piezoelectric ceramic in a polymer matrix.

In the polymeric composite piezoelectric body, the piezoelectric ceramic is hard while the polymer matrix is soft. Therefore, there is a possibility that energy may be absorbed before vibration of the piezoelectric ceramic is transmitted to the entire piezoelectric body. This is called a transmission efficiency of dynamic vibrational energy. In order to improve the transmission efficiency, the polymeric composite piezoelectric body needs to be hardened, and for doing this, the volumetric proportion of the piezoelectric ceramic added to the matrix needs to be at least 40% to 50% or higher.

For example, "Toyoki KITAYAMA, Showa 46' Journal of National Convention of The Institute of Electronics, Information and Communication Engineers, 366 (1971)" discloses that a polymeric composite piezoelectric body, which is obtained by mixing powder of PZT ceramic as a piezoelectric body with PVDF by means of solvent casting or hot kneading, establishes both the flexibility of PVDF and a high degree of piezoelectric characteristics of PZT ceramic to some extent.

However, if the proportion of the PZT ceramic is increased to improve the piezoelectric characteristics, that is, the transmission efficiency, this results in a mechanical defect that the piezoelectric body becomes hard and brittle.

In order to solve such a problem, for example, "Seiichi SHIRAI, Hiroaki NOMURA, Juro OGA, Takeshi YAMADA, and Nobuki OGUCHI, Research Report of The Institute of Electronics, Information and Communication Engineers, 24, 15 (1980)" discloses an attempt at maintaining flexibility by adding fluororubber to PVDF.

From the viewpoint of flexibility, this method produces a certain effect. However, generally, rubber has a Young's modulus of 1 MPa to 10 MPa which is an extremely small value. Therefore, the addition of the rubber decreases the hardness of the polymeric composite piezoelectric body, and as a result, the transmission efficiency of vibrational energy also decreases.

As described above, when the conventional polymeric composite piezoelectric body is used as a speaker diaphragm, if an attempt at imparting flexibility to the speaker is made, the energy efficiency unavoidably decreases. Therefore, the speaker cannot produce a sufficient performance as a speaker for a flexible display.

From the above, it is preferable for the polymeric composite piezoelectric body used as a speaker for flexible displays to satisfy the following requirements.

(i) Flexibility

For example, when a flexible display is gripped in a state of gently bent just like documents such as newspaper or a magazine as a portable apparatus, the display constantly and externally experiences severe bending deformation which is caused relatively slow and of which the frequency is several Hz or lower. At this time, if the polymeric composite piezoelectric body is hard, a bending stress as great as the hardness is caused. Consequently, the interface between the polymer matrix and particles of the piezoelectric body may crack and be broken in the end. Therefore, the polymeric composite piezoelectric body is required to have an appropriate degree of softness. If the strain energy can be caused to diffuse outside in the form of heat, the stress can be relaxed. Accordingly, the polymeric composite piezoelectric body is required to have an appropriately large loss tangent.

(ii) Sound Quality

The speaker vibrates particles of the piezoelectric body at a frequency in an audio band of 20 Hz to 20 kHz, and causes the entire diaphragm (polymeric composite piezoelectric body) to vibrate as a whole by the vibrational energy, thereby reproducing sound. Therefore, in order to increase the transmission efficiency of the vibrational energy, the polymeric composite piezoelectric body is required to have an appropriate degree of hardness. If the speaker has smooth frequency characteristics, when the lowest resonance frequency $f_0$ varies with the change in curvature, the sound quality changes in a small extent. Consequently, the loss tangent of the polymeric composite piezoelectric body needs to be appropriately great.

To summarize, the polymeric composite piezoelectric body used as a speaker for flexible displays is required to exhibit hardness with respect to vibration of 20 Hz to 20 kHz while exhibiting softness with respect to vibration of a frequency of several Hz or lower. Furthermore, the loss tangent of the polymeric composite piezoelectric body is required to be appropriately great with respect to vibration at all frequencies of 20 kHz or lower.

In order to satisfy the above requirements, the inventors of the present invention focused on a viscoelastic material which has a large frequency dispersion in a storage modulus (E') and also has a peak value of a loss tangent (Tan δ) at a temperature around normal temperature, and conducted thorough examination to apply the viscoelastic material to a matrix material. As a result, by using the viscoelastic material, the inventors have devised an electroacoustic converter film formed of a polymeric composite piezoelectric body which exhibits hardness with respect to vibration at a frequency of 20 Hz to 20 kHz while exhibiting softness with respect to vibration at a frequency of several Hz or lower, and has an appropriate loss tangent with respect to vibration at all frequencies of 20 kHz or lower.

SUMMARY OF THE INVENTION

The above electroacoustic converter film has a configuration in which electrode layers for driving are provided on both surfaces of the polymeric composite piezoelectric body, and protective layers formed of a polyethylene terephthalate (PET) film or the like are provided on the surfaces of the electrode layers in order to give minimum mechanical strength or excellent handleability as a sheet-like material to the electroacoustic converter film.

In order for such an electroacoustic converter film to exhibit hardness with respect to vibration at a frequency of 20 Hz to 20 kHz while exhibiting softness with respect to vibration at a frequency of several Hz or lower, and further have an appropriate loss tangent with respect to vibration at all frequencies of 20 kHz or lower, a product of the thickness of the electrode layer and the Young's modulus thereof is required to be smaller than a product of the thickness of the protective layer and the Young's modulus thereof.

However, since a Young's modulus of a metal material generally used for the electrode layer is much greater than that of a resin material used for the protective layer, it is necessary for the thickness of the electrode layer to be correspondingly very thin. Specifically, a deposited film or the like having a thickness of 1 μm or less is suitable for the electrode layer.

Here, in order to mount the electroacoustic converter film as a speaker or the like, it is necessary to lead out the electrode layer and connect wiring thereto. However, in a thin electrode layer such as a deposited film, the wiring cannot be connected using soldering or the like.

Furthermore, in the electroacoustic converter film, it is necessary to lead out electrode layers formed on both surfaces of a piezoelectric body layer while ensuring insulation between the electrode layers formed on both surfaces.

However, this is not easy, since the polymeric composite piezoelectric body is thin and the thickness thereof is approximately several tens microns.

An object of the present invention is to solve the aforementioned problems in the prior art. That is, in an electroacoustic converter film in which thin film electrodes are formed on both surfaces of a piezoelectric body layer formed of a polymeric composite piezoelectric body or the like, and protective layers formed of plastic film or the like are provided on both surfaces thereof, an object of the present invention is to provide an electroacoustic converter film in which leading out of electrodes from the thin film electrodes and connection of the electrodes to wiring by soldering can be easily performed, and further, the leading out of the electrodes can be performed while ensuring insulation between the thin film electrodes formed on both surfaces of the piezoelectric body layer.

In order to solve the aforementioned problems, the present invention provides an electroacoustic converter film which comprises a piezoelectric laminate composed of a polymeric composite piezoelectric body in which piezoelectric body particles are dispersed in a viscoelastic matrix formed of a polymer material that exhibits viscoelasticity at normal temperature, an upper thin film electrode formed on one surface of the polymeric composite piezoelectric body and having an area equal to or smaller than that of the polymeric composite piezoelectric body, an upper protective layer formed on a surface of the upper thin film electrode and having an area equal to or greater than that of the upper thin film electrode, a lower thin film electrode formed on a surface of the polymeric composite piezoelectric body opposite to the upper thin film electrode and having an area equal to or smaller than the polymeric composite piezoelectric body, and a lower protective layer formed on a surface of the lower thin film electrode and having an area equal to or greater than that of the lower thin film electrode; a lead-out metal foil for upper electrode which is laminated on a portion of the upper thin film electrode and of which at least a portion is located on the outside of the polymeric composite piezoelectric body in a surface direction; and a lead-out metal foil for lower electrode which is laminated on a portion of the lower thin film electrode and of which at least a portion is located on the outside of the polymeric composite piezoelectric body in a surface direction.

In the above electroacoustic converter film of the present invention, it is preferable that the electroacoustic converter film includes an insulating layer which is provided between the upper thin film electrode or further the lead-out metal foil for upper electrode and the polymeric composite piezoelectric body and of which a portion protrudes from the end portion of the polymeric composite piezoelectric body in a surface direction.

Furthermore, it is preferable that the upper thin film electrode and the upper protective layer have the same shape, the polymeric composite piezoelectric body and the lower thin film electrode or further the lower protective layer have the same shape, and the upper thin film electrode is smaller than the lower thin film electrode.

It is also preferable that the upper thin film electrode and the upper protective layer have an upper electrode lead-out portion that convexly protrudes, and the lead-out metal foil for upper electrode is laminated on the upper thin film electrode of the upper electrode lead-out portion, or further that the lower thin film electrode and the lower protective layer have a lower electrode lead-out portion that convexly protrudes, and the lead-out metal foil for lower electrode is laminated on the lower thin film electrode of the lower electrode lead-out portion.

It is also preferable that a portion of the lead-out metal foil for upper electrode is disposed between the insulating layer and the upper electrode lead-out portion.

It is also preferable that the electroacoustic converter film has either one or both of a configuration in which the lead-out metal foil for upper electrode is folded back so as to sandwich the upper electrode lead-out portion therebetween, and a configuration in which the lead-out metal foil for lower electrode is folded back so as to sandwich the lower electrode lead-out portion therebetween.

It is also preferable that the polymeric composite piezoelectric body has a concave portion formed by making a notch into an outer circumference of the polymeric composite piezoelectric body, and the lead-out metal foil for lower electrode is laminated on the lower thin film electrode such that the lead-out metal foil for lower electrode reaches the inside of the concave portion.

It is also preferable that the electroacoustic converter film includes a second upper protective layer formed on the surface of the upper protective layer or further a second lower protective layer formed on the surface of the lower protective layer.

It is also preferable that the second upper protective layer or further the second lower protective layer extends up to the outside of the piezoelectric laminate.

It is also preferable that the electroacoustic converter film includes a side surface insulating layer that is an insulating layer which covers the entire outer circumference of the end portion of the upper protective layer and covers the entire surface of the polymeric composite piezoelectric body outward beyond the upper protective layer.

It is also preferable that at least a portion of the side surface insulating layer extends up to the outside of the piezoelectric laminate.

It is also preferable that the electroacoustic converter film has either one or both of a configuration in which a through hole is provided in the upper protective layer and the lead-out metal foil for upper electrode is laminated on the upper thin film electrode through the through hole, and a configuration in which a through hole is provided in the lower protective layer and the lead-out metal foil for lower electrode is laminated on the lower thin film electrode through the through hole.

It is also preferable that the electroacoustic converter film has either one or both of a configuration in which an upper auxiliary metal foil is provided between the polymeric composite piezoelectric body and the upper thin film electrode such that the position of the upper auxiliary metal foil corresponds to the position where the through hole of the upper protective layer is formed, and a configuration in which a lower auxiliary metal foil is provided between the polymeric composite piezoelectric body and the lower thin film electrode such that the position of the lower auxiliary metal foil corresponds to the position where the through hole of the lower protective layer is formed.

It is also preferable that a plurality of through holes are provided for one electrode lead-out portion.

It is also preferable that the glass transition temperature of the polymer material at a frequency of 1 Hz is 0° C. to 50° C.

It is also that the maximum value of loss tangent (Tan δ) at a frequency of 1 Hz of the polymer material, that is 0.5 or higher and is obtained by dynamic viscoelasticity measurement, is present in a temperature range of 0° C. to 50° C.

Moreover, it is preferable that the polymer material is at least one of cyanoethylated polyvinyl alcohol, polyvinyl acetate, polyvinylidene chloride co-acrylonitrile, a polystyrene-vinyl polyisoprene block copolymer, polyvinyl methyl ketone, and polybutyl methacrylate.

According to the electroacoustic converter film of the present invention, at the time of mounting the electroacoustic converter film as a speaker or the like, the electrodes can be led out from the thin film electrodes and connected to wiring by soldering, and the leading out of the electrodes from the thin film electrodes can be performed while ensuring insulation between the thin film electrodes on both surfaces. Furthermore, according to the electroacoustic converter film of the present invention, it is possible to ensure bending resistance of an electrode lead-out portion that is required at the time of mounting the electroacoustic converter film as a speaker or the like, or using the electroacoustic converter film as a flexible speaker.

BRIEF DESCRIPTION OF THE DRAWINGS

FIGS. 4A to 4C are conceptual views explaining an example of a method of preparing the electroacoustic converter film illustrated in FIG. 1.

FIGS. 5A to 5C are conceptual views explaining another example of a method of preparing the electroacoustic converter film of the present invention, and FIG. 5D is a conceptual view explaining another example of the electroacoustic converter film of the present invention.

FIGS. 7A to 7F are conceptual views explaining another example of a method of preparing the electroacoustic converter film of the present invention.

FIGS. 10A to 10F are conceptual views explaining a thin type speaker using the electroacoustic converter film of the present invention, and a method assembling the thin type speaker.

DETAILED DESCRIPTION OF THE INVENTION

Hereinafter, an electroacoustic converter film of the present invention will be described in detail based on preferred embodiments illustrated in the accompanying drawings.

Figure 1:
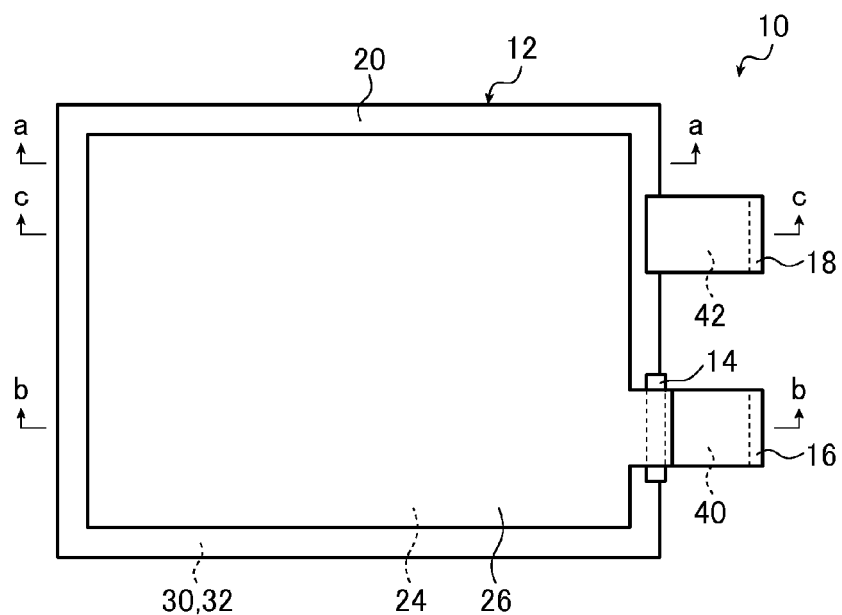
FIG. 1 is a view conceptually illustrating an example of an electroacoustic converter film of the present invention.

FIG. 1 conceptually illustrates an example of an electroacoustic converter film (hereinafter referred to as a converter film) of the present invention.

The (electroacoustic) converter film 10 illustrated in FIG. 1 is basically configured with a piezoelectric laminate 12, an insulating sheet 14, a lead-out metal foil for upper electrode 16, and a lead-out metal foil for lower electrode 18.

The converter film 10 is used in speakers, microphones, and various acoustic devices (acoustic apparatuses) such as a pickup used for musical instruments including a guitar, for generating (reproducing) sound caused by vibration occurring in response to electric signals, and for converting the vibration caused by sound into electric signals.

Figure 2A:
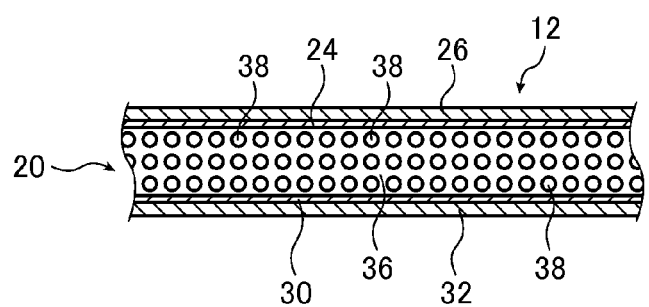
FIG. 2A is a view conceptually illustrating a cross section taken along the line a-a in FIG. 1.
Figure 2B:
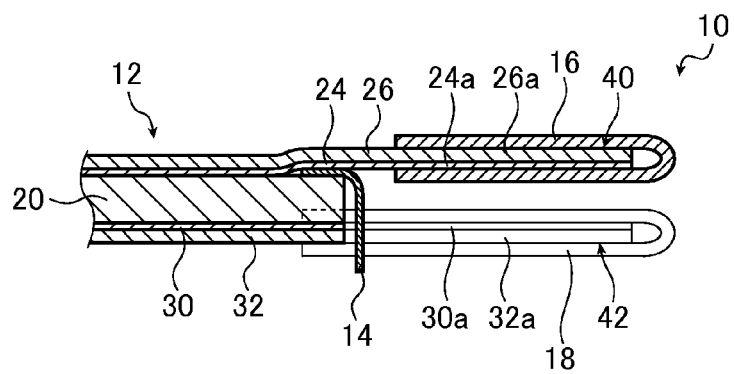
FIG. 2B is a view conceptually illustrating a cross section taken along the line b-b in FIG. 1.
Figure 2C:
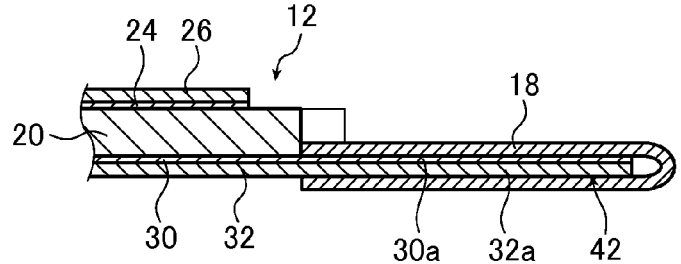
FIG. 2C is a view conceptually illustrating a cross section taken along the line c-c in FIG. 1.

As conceptually illustrated in FIG. 2A, in the converter film 10, the piezoelectric laminate 12 is configured with a piezoelectric body layer 20 that is a sheet-like material having piezoelectric properties, an upper thin film electrode 24 formed on one surface (an upper surface in the illustrated example) of the piezoelectric body layer 20, an upper protective layer 26 formed on the upper thin film electrode 24, a lower thin film electrode 30 formed on a surface opposite to the upper electrode 24 of the piezoelectric body layer 20, and a lower protective layer 32 formed on the lower thin film electrode 30 (a lower surface in FIGS. 2A to 2C).

As conceptually illustrated in FIG. 2A, the piezoelectric body layer 20 in the converter film 10 of the present invention is formed of the polymeric composite piezoelectric body that is obtained by uniformly dispersing piezoelectric body particles 38 in a viscoelastic matrix 36 formed of a polymer material that exhibits viscoelasticity at normal temperature. It should be noted that in the present specification, the "normal temperature" refers to a temperature within a range of about 0° C. to 50° C.

As will be described later, it is preferable for the piezoelectric body layer 20 to have undergone polarization processing.

As described above, the polymeric composite piezoelectric body used for a speaker having flexibility is required to exhibit hardness with respect to vibration at a frequency of 20 Hz to 20 kHz and exhibit softness with respect to vibration at a frequency of several Hz or lower. Furthermore, the loss tangent of the polymeric composite piezoelectric body is required to be appropriately great with respect to vibration at all frequencies of 20 kHz or lower.

Generally, polymer solids have a viscoelasticity relaxation mechanism. By the temperature increase or the decrease in frequency, a large scale of molecular motion of the polymer solids is observed as the decrease (relaxation) in a storage modulus (Young's modulus) or as the maximum (absorption) of a loss modulus. Particularly, the relaxation resulting from micro-Browninan motion of a molecular chain in an amorphous region is called primary dispersion and observed as an extremely large degree of relaxation. A temperature at which the primary dispersion occurs is a glass transition temperature (Tg), and the viscoelasticity relaxation mechanism is the most markedly observed at this temperature.

In the polymeric composite piezoelectric body (piezoelectric body layer 20), a polymer material having the glass transition temperature in the range of normal temperature, that is, a polymer material exhibiting viscoelasticity at normal temperature is used as a matrix, whereby a polymeric composite piezoelectric body that exhibits hardness with respect to vibration of 20 Hz to 20 kHz while exhibiting softness with respect to slow vibration of a frequency of several Hz or lower is provided. Especially, from the viewpoint of causing the polymeric composite piezoelectric body to behave preferably as above, it is preferable to use a polymer material, which has a glass transition temperature at a frequency of 1 Hz in a range of normal temperature, as a matrix of the polymeric composite piezoelectric body.

As the polymer material exhibiting viscoelasticity at normal temperature, various known materials can be used. Among these, it is preferable to use polymer materials of which the maximum value of a loss tangent Tan δ at a frequency of 1 Hz is 0.5 or higher at normal temperature when the maximum value is measured by a dynamic viscoelasticity test.

If such materials are used, when the polymeric composite piezoelectric body is gently bent by the external force, stress concentration caused in a polymer matrix-piezoelectric body particles interface in a portion where a bending moment becomes maximum is relaxed, and accordingly, a high degree of flexibility may be expected.

Moreover, a storage modulus (E') at a frequency of 1 Hz of the polymer material that is obtained by dynamic viscoelasticity measurement is preferably 100 MPa or higher at 0° C. and 10 MPa or lower at 50° C.

If the polymer material has the above property, the bending moment caused when the polymeric composite piezoelectric body is gently bent by the external force can be reduced, and the polymeric composite piezoelectric body can exhibit hardness with respect to acoustic vibration of 20 Hz to 20 kHz.

It is more preferable for the polymer material to have a dielectric constant of 10 or higher at 25° C. If the polymer material has the above property, when voltage is applied to the polymeric composite piezoelectric body, a stronger electric field is applied to the piezoelectric body particles in the polymer matrix, hence larger degree of deformation may be expected.

However, on the other hand, a polymer material having a dielectric constant of less than 10 at 25° C. is also preferable in consideration of ensuring good moisture resistance or the like.

Examples of the polymer material satisfying the above conditions include cyanoethylated polyvinyl alcohol (cyanoethylated PVA), polyvinyl acetate, polyvinylidene chloride co-acrylonitrile, polystyrene-vinyl polyisoprene block copolymer, polyvinyl methyl ketone, polybutyl methacrylate, and the like. Further, commercially available products, such as HYBRAR 5127 (manufactured by Kuraray Co., Ltd.) and the like, are also suitably used as the polymer material.

Here, one kind of the polymer material may be used alone or plural kinds thereof may be used in combination (mixture).

In the viscoelastic matrix 36 in which the polymer material exhibiting viscoelasticity at normal temperature is used, a plurality of polymer materials may be used in combination, if necessary.

That is, for the purpose of adjusting dielectric characteristics, mechanical characteristics, and the like, other dielectric polymer materials may be optionally added to the viscoelastic matrix 36 in addition to the viscoelastic material such as cynoethylated PVA.

Examples of the addible dielectric polymer material include fluorine-based polymers such as polyvinylidene fluoride, vinylidene fluoride-tetrafluoroethylene copolymers, vinylidene fluoride-trifluoroethylene copolymers, polyvinylidene fluoride-trifluoroethylene copolymers, and polyvinylidene fluoride-tetrafluoroethylene copolymers; cyano group- or cyanoethyl group-containing polymers such as vinylidene cyanide-vinyl acetate copolymers, cyanoethyl cellulose, cyanoethyl hydroxysaccharose, cyanoethyl hydroxycellulose, cyanoethyl hydroxypullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethyl pullulan, cyanoethyl polyhydroxymethylene, cyanoethyl glycidol pullulan, cyanoethyl saccharose, and cyanoethyl sorbitol; synthetic rubbers such as nitrile rubber and chloroprene rubber, and the like.

Among these, the cyanoethyl group-containing polymer materials are suitably used.

In addition, the dielectric polymer that can be added to the viscoelastic matrix 36 of the piezoelectric body layer 20 in addition to the material exhibiting viscoelasticity at normal temperature such as cyanoethylated PVA is not limited to one kind, and plural kinds thereof may be added.

Furthermore, in addition to the dielectric polymer, a thermoplastic resin such as a vinyl chloride resin, polyethylene, polystyrene, a methacrylic resin, polybutene, and isobutylene, or a thermosetting resin such as a phenol resin, a urea resin, a melamine resin, an alkyd resin, and mica may be added for the purpose of adjusting a glass transition point (Tg).

Moreover, a tackifier such as rosin ester, rosin, terpene, terpene phenol, and a petroleum resin may be added for the purpose of improving adhesiveness.

The amount of the polymer, which is added to the viscoelastic matrix 36 of the piezoelectric body layer 20, other than the viscoelastic material such as cyanoethylated PVA is not particularly limited. However, it is preferable for the polymer to be added in such an amount that a proportion of the polymer accounting for the viscoelastic matrix 36 becomes 30% by weight or less.

If the polymer is added in such an amount, characteristics of the added polymer material can be expressed without impairing the viscoelasticity relaxation mechanism in the viscoelastic matrix 36. Accordingly, from the viewpoints such as increase in a dielectric constant, improvement of heat resistance, and improvement of adhesiveness with the piezoelectric body particles 38 or the electrode layer, preferable results can be obtained.

In the converter film 10 of the present invention, other than the above viscoelastic matrix 36, various polymer materials used for known polymeric composite piezoelectric bodies can be used as a matrix of the piezoelectric body layer (polymeric composite piezoelectric body). Specifically, polyvinylidene fluoride (PVDF), cyanoethylated pullulan, nylon, and the like are exemplified.

The piezoelectric body particles 38 are formed of ceramics particles having a perovskite crystal structure or a wurtzite crystal structure.

Examples of the ceramic particles composing the piezoelectric body particles 38 include lead zirconate titanate (PZT), lead lanthanum zirconate titanate (PLZT), barium titanate (BaTiO$_3$), zinc oxide (ZnO), a solid solution (BFBT) consisting of barium titanate and bismuth ferrite (BiFe$_3$), and the like.

The particle size of the piezoelectric body particles 38 may be appropriately selected according to the size or use of the converter film 10. However, according to the examination conducted by the present inventors, the particle size of the piezoelectric body particles 38 is preferably 1 μm to 20 μm.

If the particle size of the piezoelectric body particles 38 is within the above range, it is possible to obtain preferable results from the viewpoints that a high degree of piezoelectric characteristics become compatible with flexibility, and the like.

In FIG. 1 and the like, the piezoelectric body particles 38 in the piezoelectric body layer 20 have dispersed with regularity in the viscoelastic matrix 36. However, the present invention is not limited thereto.

That is, as long as the piezoelectric body particles 38 uniformly disperse in the piezoelectric body layer 20, they may not regularly disperse in the viscoelastic matrix 36.

In the converter film 10 of the present invention, the ratio between the amount of the viscoelastic matrix 36 and the amount of the piezoelectric body particles 38 in the piezoelectric body layer 20 (polymeric composite piezoelectric body) may be appropriately set according to the size (size in the surface direction) or thickness of the converter film 10, the use of the converter film 10, characteristics required for the converter film 10, and the like.

According to the examination conducted by the present inventors, the volumetric proportion of the piezoelectric body particles 38 in the piezoelectric body layer 20 is preferably 30% to 70%, and particularly preferably 50% or higher. Therefore, the volumetric proportion is more preferably 50% to 70%.

If the ratio between the amount of the viscoelastic matrix 36 and the amount of the piezoelectric body particles 38 is within the above range, it is possible to obtain preferable results from the viewpoints that a high degree of piezoelectric characteristics become compatible with flexibility, and the like.

Moreover, in the converter film 10 of the present invention, the thickness of the piezoelectric body layer 20 is not particularly limited. The thickness may be appropriately set according to the size and use of the converter film 10, characteristics required for the converter film 10, and the like.

According to the examination conducted by the present inventors, the thickness of the piezoelectric body layer 20 is preferably 10 μm to 200 μm, and particularly preferably 15 μm to 100 μm.

If the thickness of the piezoelectric body layer 20 is within the above range, it is possible to obtain preferable results from the viewpoints that securing of rigidity and appropriate ductility can be established at the same time, and the like.

It should be noted that as described above, it is preferable for the piezoelectric body layer 20 to have undergone polarization processing (polling). The detail of the polarization processing will be described later.

As illustrated in FIG. 2A, in the converter film 10 of the present invention, the piezoelectric laminate 12 has a configuration in which the upper thin film electrode 24 is formed on one surface of the piezoelectric body layer 20, the upper protective layer 26 is formed on the upper thin film electrode 24, the lower thin film electrode 30 is formed on the other surface of the piezoelectric body layer 20, and the lower protective layer 32 is formed on the lower thin film electrode 30.

That is, the piezoelectric laminate 12 has a configuration in which the upper thin film electrode 24 and the lower thin film electrode 30 interpose the piezoelectric body layer 20 therebetween, and the upper protective layer 26 and the lower protective layer 32 interpose the resulting laminate therebetween.

In the converter film 10, the upper protective layer 26 and the lower protective layer 32 play a role of giving appropriate rigidity and mechanical strength to the piezoelectric body layer 20. That is, in the converter film 10 of the present invention, the piezoelectric body layer 20 (polymeric composite piezoelectric body) composed of the viscoelastic matrix 36 and the piezoelectric body particles 38 exhibits excellent flexibility when suffering from gentle bending deformation. However, depending on the use thereof, the rigidity or mechanical strength of the piezoelectric body layer 20 is insufficient in some cases. The converter film 10 is provided with the upper protective layer 26 and the lower protective layer 32 to correct such a flaw.

The upper protective layer 26 and the lower protective layer 32 are not particularly limited, and various sheet-like materials can be used. Preferable examples thereof include various resin films (plastic films). Among these, polyethylene terephthalate (PET), polypropylene (PP), polystyrene (PS), polycarbonate (PC), polyphenylene sulfide (PPS), polymethyl methacrylate (PMMA), polyetherimide (PEI), polyimide (PI), polyethylene naphthalate (PEN), triacetylcellulose (TAC), and cyclic olefin resins are preferably used since these have excellent mechanical characteristics and heat resistance.

The thickness of the upper protective layer 26 and the lower protective layer 32 is also not particularly limited. Basically, the upper protective layer 26 and the lower protective layer 32 have the same thickness, but the thickness may be different.

If the rigidity of the upper protective layer 26 and the lower protective layer 32 is too high, the expansion and contraction of the piezoelectric body layer 20 is restricted, and the flexibility is also impaired. Accordingly, except for the case that requires mechanical strength or excellent handleability as a sheet-like material, the thinner the upper protective layer 26 and the lower protective layer 32 are, the more advantageous the invention is.

When the upper protective layer 26 and the lower protective layer 32 are very thin and the handleability thereof is poor, an upper protective layer 26 and/or a lower protective layer 32 with a peelable separator (support) may be used. The separator may also be provided in sheet-like materials 46a and 46c illustrated in FIGS. 3A and 3E to be described later. As the separator, a PET film or the like having a thickness of approximately 25 μm to 100 μm is exemplified.

Basically, the separator may be peeled off after the upper protective layer 26 and/or the lower protective layer 32 are (is) stuck to the converter film 10. In a case in which a side surface insulating layer 60, a second upper protective layer 64, or the like to be described later is provided, it is preferable that the separator is peeled off immediately before the side surface insulating layer 60, the second upper protective layer 64, or the like is provided.

According to the examination conducted by the present inventors, if the thickness of the upper protective layer 26 and the lower protective layer 32 is not greater than two times the thickness of the piezoelectric body layer 20, it is possible to obtain preferable results from the viewpoints that securing of rigidity and appropriate flexibility can be established at the same time, and the like.

For example, when the thickness of the piezoelectric body layer 20 is 50 μm, and the upper protective layer 26 and the lower protective layer 32 are formed of PET, the thickness of the upper protective layer 26 and the lower protective layer 32 is preferably 100 μm or less, more preferably 50 μm or less, and particularly preferably 25 μm or less.

In the converter film 10 of the present invention, the upper thin film electrode 24 (hereinafter, also referred to as a "upper electrode 24") is formed between the piezoelectric body layer 20 and the upper protective layer 26, and the lower thin film electrode 30 (hereinafter, also referred to as a "lower electrode 30") is formed between the piezoelectric body layer 20 and the lower protective layer 32.

The upper electrodes 24 and the lower electrode 30 are provided to apply an electric filed to the converter film 10 (piezoelectric body layer 20).

In the present invention, the material forming the upper electrode 24 and the lower electrode 30 is not particularly limited, and various conductive materials can be used. Preferable examples thereof specifically include carbon, palladium, iron, tin, aluminum, nickel, platinum, gold, silver, copper, chromium, molybdenum, alloys of these, indium tin oxide, and the like. Among these, any one of copper, aluminum, gold, silver, platinum, and indium tin oxide is preferable.

Moreover, the formation method of the upper electrode 24 and the lower electrode 30 is not particularly limited, and it is possible to use various known methods including a film formation method implemented by a vapor-phase deposition method (vacuum film formation method) such as vacuum deposition or sputtering, or plating, and a method of sticking foil formed of the above material to the piezoelectric body layer.

Particularly, a thin film of copper or aluminum formed by vacuum deposition is suitably used as the upper electrode 24 and the lower electrode 30, since this film can secure flexibility of the converter film 10. Especially, a thin copper film formed by vacuum deposition is suitably used.

The thickness of the upper electrode 24 and the lower electrode 30 is not particularly limited. Basically, the upper electrode 24 and the lower electrode 30 have the same thickness, but the thickness may be different.

As in the upper protective layer 26 and the lower protective layer 32 described above, if the rigidity of the upper electrode 24 and the lower electrode 30 is too high, the expansion and contraction of the piezoelectric body layer 20 is restricted, and the flexibility is impaired. Accordingly, the thinner the upper electrode 24 and the lower electrode 30 are, the more advantageous the invention is, as long as the electric resistance does not become too high.

According to the examination conducted by the present inventors, it is preferable that a product of the thickness of the upper and lower electrodes 24 and 30 and a Young's modulus thereof be smaller than a product of the thickness of the upper and lower protective layers 26 and 32 and a Young's modulus thereof, since the flexibility is not significantly impaired.

For example, when a combination of the upper and lower protective layers 26 and 32 formed of PET (Young's modulus: about 6.2 GPa) and the upper and lower electrodes 24 and 30 formed of copper (Young's modulus: about 130 GPa) is used, provided that the thickness of the upper and lower protective layers 26 and 32 is 25 μm, the thickness of the upper and lower electrodes 24 and 30 is preferably 1.2 μm or less, more preferably 0.3 μm or less, and particularly preferably 0.1 μm or less.

In addition, the upper electrode 24 and/or the lower electrode 30 are (is) not necessarily formed on the entire surface of the piezoelectric body layer 20 (the upper protective layer 26 and/or the lower protective layer 32).

That is, the converter film 10 may be configured such that at least one of the upper electrode 24 and the lower electrode 30 is smaller than, for example, the piezoelectric body layer 20, and the piezoelectric body layer 20 comes into direct contact with the protective film in the peripheral portion of the converter film 10.

As will be described later in detail, in the example illustrated in FIGS. 1 and 2A to 2C, the lower electrode 30 and the lower protective layer 32 have the same shape (the same size), the lower electrode 30 and the piezoelectric body layer 20 have the same main surface (a surface other than a lower protruded island portion 42 to be described later), and the upper electrode 24 and the upper protective layer 26 have the same shape (the same size) and are slightly smaller than the lower electrode 30.

As described above, the piezoelectric laminate 12 used in the converter film 10 of the present invention has a configuration in which the piezoelectric body layer 20 (polymeric composite piezoelectric body) formed by dispersing the piezoelectric body particles 38 in the viscoelastic matrix 36 that exhibits viscoelasticity at normal temperature is interposed between the upper electrode 24 and the lower electrode 30, and the resulting laminate is interposed between the upper protective layer 26 and the lower protective layer 32.

In the piezoelectric laminate 12, it is preferable that the maximum value of a loss tangent (Tan δ) at a frequency of 1 Hz, which is 0.1 or higher and is obtained by dynamic viscoelasticity measurement, is present at normal temperature.

If the maximum value is present at normal temperature, even if the converter film 10 externally experiences severe bending deformation which is caused relatively slow and of which the frequency is several Hz or lower, the strain energy can be caused to diffuse outside in the form of heat. Accordingly, it is possible to prevent the interface between the polymer matrix and the piezoelectric body particles from cracking.

Furthermore, a storage modulus (E') at a frequency of 1 Hz of the piezoelectric laminate 12 that is obtained by dynamic viscoelasticity measurement is preferably 10 GPa to 30 GPa at 0° C. and 1 GPa to 10 GPa at 50° C.

If the storage modulus is as above, the converter film 10 can have large frequency dispersion in the storage modulus (E') at normal temperature. That is, the converter film 10 can exhibit hardness with respect to vibration of 20 Hz to 20 kHz while exhibiting softness with respect to vibration of a frequency of several Hz or lower.

In addition, in the piezoelectric laminate 12, a product of the thickness of the piezoelectric laminate 12 and the storage modulus (E') at a frequency of 1 Hz of the piezoelectric laminate 12 that is obtained by dynamic viscoelasticity measurement is preferably $1.0 \times 10^6$ N/m to $2.0 \times 10^6$ N/m (1.0 E+06 N/m to 2.0 E+06 N/m) at 0° C. and $1.0 \times 10^5$ N/m to $1.0 \times 10^6$ N/m (1.0 E+05 N/m to 1.0 E+06 N/m) at 50° C.

If the product is within the above range, the converter film 10 can have appropriate rigidity and mechanical strength within a range that does not impair flexibility and acoustic characteristics.

Moreover, in the piezoelectric laminate 12, it is preferable that the loss tangent (Tan δ) at a frequency of 1 kHz at 25° C. of the piezoelectric laminate 12 is 0.05 or higher in a master curve obtained by dynamic viscoelasticity measurement.

If the loss tangent is as above, the speaker using the converter film 10 has smooth frequency characteristics, and thus, when the lowest resonance frequency $f_0$ varies with the change in the curvature of the speaker, a degree of change in the sound quality can be reduced.

As described above, the converter film 10 of the present invention has the insulating sheet 14, the lead-out metal foil for upper electrode 16, and the lead-out metal foil for lower electrode 18, in addition to the piezoelectric laminate 12.

The insulating sheet 14 is a sheet-like material formed of a material having insulating properties, such as, for example, a polyimide tape. Further, the lead-out metal foil for upper electrode 16 and the lead-out metal foil for lower electrode 18 are sheet-like material formed of a metal material having electrical conductivity, such as, for example, a copper foil film.

As described above, in the converter film 10 of the illustrated example, the upper electrode 24 and the upper protective layer 26 have the same shape. In the upper electrode 24 and the upper protective layer 26, upper electrode lead-out portions 24a and 26a, which protrude convexly in a surface direction from the rectangular main surfaces thereof, are formed (hereinafter, the portions are also collectively referred to as an upper protruded island portion 40) (see FIG. 4C).

As illustrated in FIG. 2B, the lead-out metal foil for upper electrode (hereinafter also referred to as an upper metal foil) 16 is provided to be laminated on the upper electrode 24 in the upper protruded island portion 40. In the illustrated example, as a preferred embodiment, the upper metal foil 16 is provided so as to be folded back in a protrusion direction of the upper protruded island portion 40 and to sandwich the upper electrode 24 and the upper protective layer 26 from both sides.

In the converter film 10 of the illustrated example, the lower electrode 30 and the lower protective layer 32 have the same shape. Also in the lower electrode 30 and the lower protective layer 32, lower electrode lead-out portions 30a and 32a, which protrude convexly in a surface direction from the rectangular main surfaces thereof, are formed (hereinafter, the portions are also collectively referred to as a lower protruded island portion 42) (see FIG. 4B).

As conceptually illustrated in FIG. 2C, the lead-out metal foil for lower electrode (hereinafter also referred to as a lower metal foil) 18 is laminated on the lower electrode 30 of the lower protruded island portion 42. As will be described later, in the illustrated example, the lower metal foil 18 is provided such that the end portion thereof is inserted into the piezoelectric body layer 20. Further, in the illustrated example, as a preferred embodiment, the lower metal foil 18 is provided so as to be folded back in a protrusion direction of the lower protruded island portion 42 and to sandwich the lower electrode 30 and the lower protective layer 32 from both sides.

Furthermore, in the converter film 10 of the present invention, the insulating sheet (insulating layer) 14 is inserted between the upper electrode 24 and the piezoelectric body layer 20 in the formation position of the upper protruded island portion 40.

The insulating sheet 14 is provided such that in a surface direction, it encompasses the entire region of the upper protruded island portion 40 in a direction (a vertical direction in FIG. 1; hereinafter also referred to a width direction) orthogonal to the protrusion of the upper island portion 40 and protrudes from the end portion of the piezoelectric body layer 20 in a protrusion direction (hereinafter also referred to a longitudinal direction) of the upper protruded island portion 40.

In the converter film 10 of the present invention, the upper metal foil 16 and the lower metal foil 18 connected to the upper electrode 24 and the lower electrode 30 are provided to lead out the electrodes from the upper electrode 24 and the lower electrode 30, to reinforce both electrodes and both protective layers that are thin films, and to enable the electrodes to be wired and connected by soldering. Further, each of the upper metal foil 16 and the lower metal foil 18 is preferably folded back so as to sandwich the electrode and the protective layer from both sides, and thereby, the electrode and the protective layer can be more suitably reinforced, and it becomes possible to select a surface on which soldering to connect wiring is performed.

In addition, in the configuration in which the upper electrode 24 is led out by the above-described upper protruded island portion 40 and the upper metal foil 16, by providing the insulating sheet 14, the upper metal foil 16 and the lower electrode 30 can be electrically insulated even if the upper metal foil 16 comes in contact with the end surface of the piezoelectric laminate 12. For example, when the conversion film 10 is incorporated into a case, as illustrated in FIG. 10F which will be described later, the upper metal foil 16 and the lower electrode 30 can be electrically insulated even when the upper metal foil 16 crosses the end portion of the piezoelectric laminate 12. That is, by providing the insulating sheet 14, the aforementioned leading out of the electrode layers can be performed while ensuring the insulation between the upper electrode 24 and the lower electrode 30.

The insulating sheet 14 (insulating layer) is provided when at least one of the upper electrode 24 and the lower electrode 30 has the same size as the piezoelectric body layer 20 (in the electrode lead-out portion from the thin film electrode, when end portions of the thin film electrode and the piezoelectric body layer 20 match each other). Therefore, when both of the upper electrode 24 and the lower electrode 30 are smaller than the piezoelectric body layer 20 (in the electrode lead-out portion, when the end portion of the piezoelectric body layer 20 is outside of the end portion of the thin film electrode), the insulating sheet 14 is unnecessary. This point will be described later in detail with reference to FIG. 18.

Furthermore, in the illustrated example, as a preferred embodiment, the upper protruded island portion 40 and the lower protruded island portion 42 are provided, and the upper metal foil 16 and the lower metal foil 18 are laminated thereon.

With this configuration, the upper metal foil 16 and the lower metal foil 18 can be arranged to be spaced apart from a region of the piezoelectric laminate 12 acting as a speaker. Therefore, the upper metal foil 16 and the lower metal foil 18 that are thicker than the upper electrode 24 and the lower electrode 30 do not interfere with the vibration of the piezoelectric body layer 20.

As described above, the end portion of the lower metal foil 18 is in a state of being inserted into the piezoelectric layer 20. However, the region acting as a speaker or the like in the converter film 10 is a region in which the upper electrode 24 and the lower electrode 30 face each other. In addition, the upper electrode 24 is smaller than the lower electrode 30. Therefore, since the region in which the lower metal foil 18 and the piezoelectric body layer 20 overlap each other does not act as a speaker or the like, this region does not adversely affect the acoustic properties of the converter film 10.

As for the width (a direction orthogonal to a protrusion direction of the upper protruded island portion 40 in a surface direction; a vertical direction in FIG. 1) and length (a direction orthogonal to the width direction) of the upper protruded island portion 40 and the lower protruded island portion 42, a size capable of leading out the electrodes and ensuring conductivity with the outside at the time of implementation of the converter film 10 may be appropriately set.

Furthermore, other than the rectangular shape in the illustrated example, a variety of shapes capable of leading out the electrodes can also be used as the size and shape of the upper metal foil 16 and the lower metal foil 18. That is, the size and shape of the upper metal foil 16 and the lower metal foil 18 may be appropriately set according to the size and shape of the upper protruded island portion 40 and the lower protruded island portion 42, so that conductivity with the upper protruded island portion 40 and the lower protruded island portion 42 can be ensured, and connection to wiring can be made at the time of implementation of the converter film 10.

In the converter film 10 of the present invention, both of the upper protruded island portion 40 and the lower protruded island portion 42 are preferably provided, but any one of them may be provided. In the case in which any one of the upper protruded island portion 40 and the lower protruded island portion 42 is provided, it is preferable to provide only the upper protruded island portion 40.

When only one of the upper protruded island portion 40 and the lower protruded island portion 42 is provided, a metal foil is directly laminated on the main surface of the electrode on the side in which the protruded island portion is not provided.

The upper metal foil 16 and the lower metal foil 18 may be formed of a variety of conductive materials. Specifically, copper, aluminum, gold, and silver are suitably exemplified.

As the attachment method of the upper metal foil 16 and the lower metal foil 18, various known attachment methods of a sheet-like material can be used according to the material forming the metal foils.

As for the thickness of the upper metal foil 16 and the lower metal foil 18, a thickness capable of ensuring sufficient strength and being subjected to soldering may be appropriately determined according to the material forming the metal foils. Specifically, it is preferable that the thickness of the upper metal foil 16 and the lower metal foil 18 is greater than that of the upper electrode 24 and the lower electrode 30. Particularly, it is preferable that the thickness is approximately 30 μm to 70 μm.

Meanwhile, the insulating sheet 14 may be formed of various materials having insulating properties. Specifically, PI, PET, PEN, PP, and the like are preferably exemplified. Among these, polyimide is preferably used.

As the attachment method of the insulating sheet 14, various known attachment methods of a sheet-like material may be used according to the material forming the insulating sheet 14.

As for the thickness of the insulating sheet 14, a thickness capable of ensuring insulating properties may be appropriately set, according to the material thereof. Here, considering the acoustic properties and the like of the converter film 10, a thinner insulating sheet 14 is preferable in a range in which insulating properties can be ensured. Specifically, the thickness of the insulating layer 14 is preferably 50 μm or less, and particularly preferably 20 μm or less.

The length in the longitudinal direction of the insulating sheet 14 may be set such that the insulating sheet 14 can be reliably inserted between the upper electrode 24 and the piezoelectric body layer 20 in a range in which it does not reach the main surface of the upper electrode 24, and a protrusion amount thereof from the end portion of the piezoelectric body layer 20 is equal to or larger than the thickness of the piezoelectric laminate 12.

In the illustrated example, as a preferred embodiment, the upper protruded island portion 40 and the lower protruded island portion 42 (that is, the electrode lead-out portions from the upper and lower electrode layers) are formed on the same side of the converter film 10.

However, in the converter film 10 of the present invention, the upper protruded island portion 40 and the lower protruded island portion 42 may be formed on different sides to lead out the electrodes, in response to the configuration or the like of the converter film 10 at the time of implementation of the converter film 10 as a speaker, which will be described later (see FIG. 5C). Generally, heat is easily generated in the vicinity of the electrode lead-out portion since a current is concentrated on the vicinity thereof. Accordingly, for example, the upper protruded island portion 40 and the lower protruded island portion 42 are separated as illustrated in FIG. 5C, and thus it is possible to prevent the heat generation from being concentrated on one place of the converter film.

The upper protruded island portion 40 and the lower protruded island portion 42 may be formed at positions in which at least portions of the upper protruded island portion 40 and the lower protruded island portion 42 overlap when viewed from a direction orthogonal to a surface direction.

In the illustrated example, a pair of the upper protruded island portion 40 and the lower protruded island portion 42 is provided, but the present invention is not limited thereto.

For example, as conceptually illustrated in FIG. 5D, two pairs of upper protruded island portions 40 and lower protruded island portions 42 may be provided for one converter film. Alternatively, three or more pairs of upper protruded island portions 40 and lower protruded island portions 42 may be provided for one converter film.

In general, heat is easily generated in the vicinity of the electrode lead-out portion since the current is concentrated on the vicinity thereof. Accordingly, by providing a plurality of upper protruded island portions 40 and a plurality of lower protruded island portions 42, it is possible to lower the amount of current per one electrode lead-out portion, and thus to disperse the heat generation.

As illustrated in FIGS. 1 and 2B, in the converter film 10, the upper metal foil 16 is spaced apart from the piezoelectric body layer 20. Therefore, the spacing region between the upper metal foil 16 and the piezoelectric body layer 20 only includes the upper electrode 24 and the upper protective layer 26, and thus the mechanical strength of the region is low. However, the converter film 10 is mainly intended to be used in a fixed state, like a thin type speaker 84 illustrated in FIG. 10F to be described later. Therefore, after the converter film 10 is once incorporated into the speaker, the upper protruded island portion 40 is not usually subjected to bending, stretching, or the like, again (the same applies to the lower protruded island portion 42). Therefore, if the converter film 10 is once appropriately implemented, there is usually no problem even when the strength of the region in which the upper metal foil 16 is spaced apart from the piezoelectric body layer 20 is low.

Figure 12:
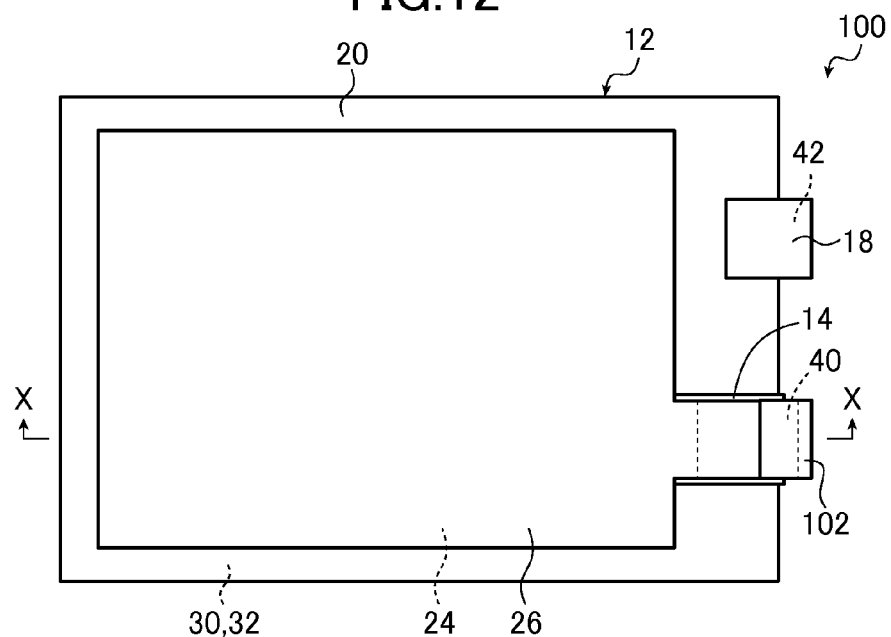
FIG. 12 is a view conceptually illustrating another example of the electroacoustic converter film of the present invention.
Figure 13:
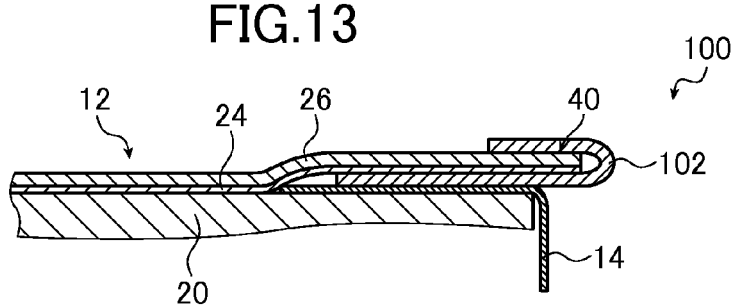
FIG. 13 is a view conceptually illustrating a cross section taken along the line X-X in FIG. 12.

However, in the converter film 10, if necessary, the strength of the electrode lead-out portion from the upper electrode 24 may be improved by extending the end portion of the upper metal foil 16 up to a position in which the end portion of the upper metal foil 16 is laminated on the piezoelectric body layer 20, and sandwiching the upper metal foil 16 by the insulating sheet 14 and the upper electrode 24 therebetween, as illustrated in FIGS. 12 and 13.

Hereinafter, the converter film 10 of present invention will be described in more detail by explaining an example of a method of preparing the converter film 10 with reference to the conceptual views shown in FIGS. 3A to 3E and FIGS. 4A to 4C.

Figure 3A:
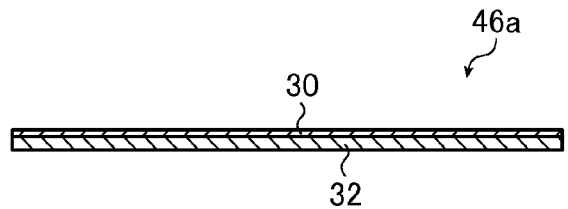
FIGS. 3A to 3E are conceptual views explaining an example of a method of preparing the electroacoustic converter film illustrated in FIG. 1.

First, as illustrated in FIG. 3A, a sheet-like material 46a in which the lower electrode 30 is formed on the lower protective layer 32 is prepared.

The sheet-like material 46a may be prepared by forming a thin copper film or the like as the lower electrode 30 on the surface of the lower protective layer 32 by means of vacuum deposition, sputtering, plating, or the like. Alternatively, a commercially available product in which a thin copper film or the like is formed on the surface of the lower protective layer 32 may be used.

Meanwhile, a polymer material (hereinafter, also referred to as a "viscoelastic material") such as cyanoethylated PVA that exhibits viscoelasticity at room temperature is dissolved in an organic solvent, the piezoelectric body particles 38 such as PZT particles are added thereto and dispersed by stirring, whereby a coating material is prepared. The organic solvent is not particularly limited, and various organic solvents such as dimethylformamide (DMF), methyl ethyl ketone, and cyclohexanone can be used.

Figure 3B:
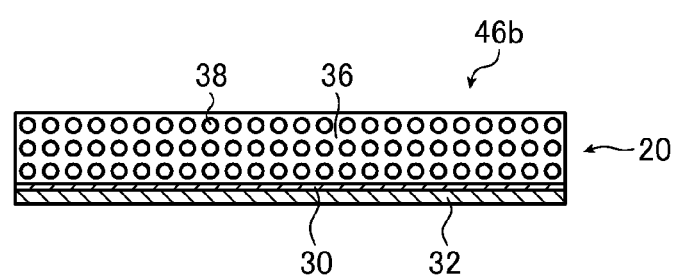

After the above sheet-like substance 46a and the coating material are prepared, the coating material is casted (coated) to the sheet-like substance 46a, and the organic solvent is evaporated to dry the resultant. In this manner, as illustrated in FIG. 3B, a laminate 46b in which the lower electrode 30 is formed on the lower protective layer 32 and the piezoelectric body layer 20 is formed on the lower electrode 30 is prepared.

The casting method of the coating material is not particularly limited, and all of the known methods (coating apparatuses) such as a slide coater or a doctor knife can be used.

Alternately, if the viscoelastic material is a material that can be melted by heating just like cyanoethylated PVA, the viscoelastic material may be melted by heating, and the piezoelectric body particles 38 may be added and dispersed into the resultant to prepare a melt. By extrusion molding or the like, the melt may be extruded in the form of sheet onto the sheet-like substance shown in FIG. 3A and then cooled, whereby the laminate 46b in which the lower electrode 30 is formed on the lower protective layer 32 and the piezoelectric body layer 20 is formed on the lower electrode 30 as illustrated in FIG. 3B may be prepared.

As described above, in the converter film 10 of the present invention, piezoelectric polymer materials such as PVDF may be added to the viscoelastic matrix 36 in addition to the viscoelastic material such as cyanoethylated PVA.

When being added to the viscoelastic matrix 36, the piezoelectric polymer material to be added may be dissolved in the aforementioned coating material. Alternately, the piezoelectric polymer material to be added may be added to the viscoelastic material melted by heating, and the resultant may be melted by heating.

After the laminate 46b in which the lower electrode 30 is formed on the lower protective layer 32 and the piezoelectric body layer 20 is formed on the lower electrode 30 is prepared, it is preferable to perform polarization processing (polling) on the piezoelectric body layer 20.

The method of the polarization processing performed on the piezoelectric body layer 20 is not particularly limited, and the known methods can be used. Examples of preferable polarization methods include the method described in FIGS. 3C and 3D.

Figure 3C:
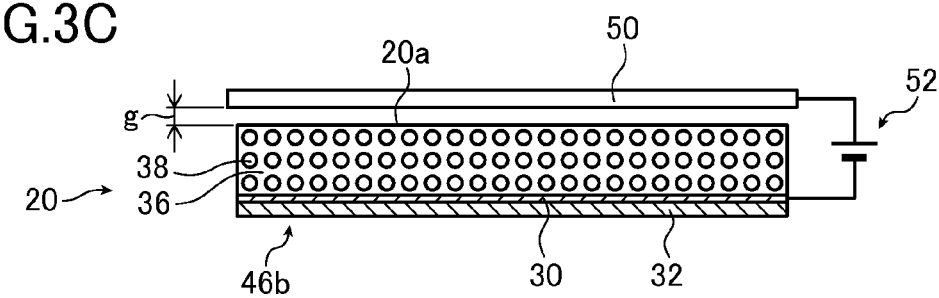
Figure 3D:
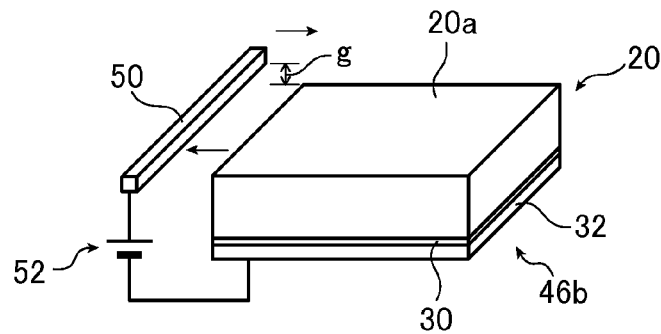

In this method, as illustrated in FIGS. 3C and 3D, a rod-like or wire-like movable corona electrode 50 is placed above an upper surface 20a of the piezoelectric body layer 20 of the laminate 46b along the upper surface 20a, in a state where there is a space g of, for example, 1 mm, between the electrode and the upper surface. Then the corona electrode 50 and the lower electrode 30 are connected to a DC power supply 52.

Moreover, heating means for heating and holding the laminate 46b, for example, a hot plate is prepared.

Thereafter, in a state where the piezoelectric body layer 20 is heated and held by the heating means at, for example, 100° C., DC voltage of several kV, for example, 6 kV, is applied between the lower electrode 30 and the corona electrode 50 from the DC power supply 52, whereby corona discharge is caused to occur. Moreover, in a state where the space g is maintained as is, the corona electrode 50 is moved (caused to scan) along the upper surface 20a of the piezoelectric body layer 20 to perform polarization processing on the piezoelectric body layer 20.

In the polarization processing using corona discharge as above (hereinafter, for convenience, the processing will also be referred to as corona polling processing), the corona electrode 50 may be moved by using the known rod-like moving means.

In addition, in the corona polling processing, the method thereof is not limited to the method in which the corona electrode 50 is moved. That is, the corona electrode 50 may be fixed, and a moving mechanism for moving the laminate 46b may be provided to move the laminate 46b for performing the polarization processing. For moving the laminate 46b, the known sheet-like material moving means may be used.

Moreover, the number of the corona electrode 50 is not limited to one, and plural corona electrodes 50 may be used for performing corona polling processing.

Furthermore, the polarization processing is not limited to the corona polling processing, and it is possible to use ordinary electric field polling that directly applies direct electric field to a target to be subjected to the polarization processing. Here, for performing the ordinary electric field polling, the upper electrode 24 needs to be formed before the polarization processing.

Before the polarization processing, calendar processing for smoothening the surface of the piezoelectric body layer 20 by using a heating roller or the like may be performed. If the calendar processing is performed, a thermocompression bonding step, which will be described later, can be smoothly conducted.

After the polarization processing of the piezoelectric body layer 20 of the laminate 46b is performed in the aforementioned manner, the laminate 46b is cut according to a shape of the converter film 10, as illustrated in FIG. 4A. That is, in the illustrated example, the laminate 46b is cut in a form in which the rectangular lower protruded island portion 42 is formed to protrude from the rectangular main surface, as illustrated in FIG. 4A.

Then, the piezoelectric body layer 20 is removed in the lower protruded island portion 42 and a region located slightly inward from the lower protruded island portion 42

(center side of the laminate 46b) to expose the lower electrode 30 (lower electrode lead-out portions 30a), as illustrated in FIG. 4B. As the method of removing the piezoelectric body layer 20, for example, a method of dissolving and removing the piezoelectric body layer 20 by impregnating a cotton swab or the like with a solvent capable of dissolving the viscoelastic matrix 36, and rubbing the piezoelectric body layer 20 with the cotton swab or the like is exemplified.

Furthermore, the insulating sheet 14 is arranged at a position corresponding to the upper protruded island portion 40.

Meanwhile, a sheet-like material 46c in which the upper electrode 24 is formed on the upper protective layer 26 is prepared. The sheet-like material 46c is the same as the aforementioned sheet-like material 46a.

As illustrated in FIG. 4C, the sheet-like material 46c is cut according to the shape of the converter film 10. That is, in the illustrated example, as illustrated in FIG. 4C, the sheet-like material 46c is cut to be a form in which the rectangular upper protruded island portion 40 is formed to protrude from the rectangular main surface. Here, the sheet-like material 46c is cut to be smaller than the aforementioned laminate 46b.

Figure 3E:
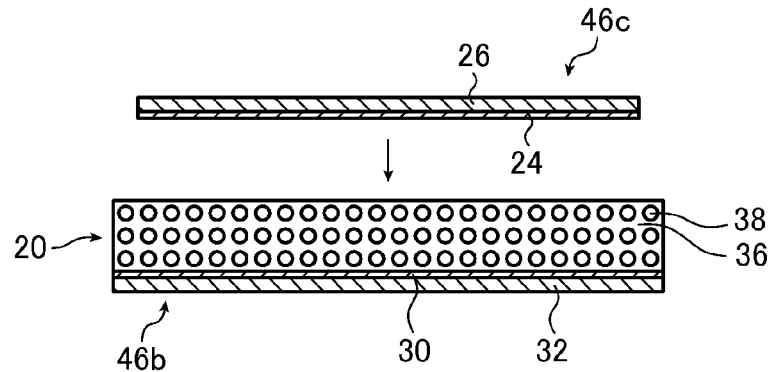

Thereafter, as illustrated in FIGS. 3E and 4C, the cut sheet-like material 46c is laminated on the laminate 46b having undergone the polarization processing of the piezoelectric body layer 20, in a state in which the upper electrode 24 faces the piezoelectric body layer 20. Since the sheet-like material 46c is smaller than the laminate 46b as described above, the sheet-like material 46c is laminated on the laminate 46b such that a margin of the piezoelectric body layer 20 is formed in the entire periphery of the upper electrode 24 and the upper protective layer 26.

Moreover, the laminate of the laminate 46b and the sheet-like material 46c is subjected to thermocompression bonding by using a heating press apparatus, a pair of heating roller, or the like, in a state in which the laminate is interposed between the upper protective layer 26 and the lower protective layer 32. In this manner, the piezoelectric laminate 12 in which the insulating sheet 14 is interposed at a position corresponding to the upper protruded island portion 40 is prepared.

Alternatively, when the sheet-like material 46c is laminated on the laminate 46b, an adhesive may be applied to the sheet-like material 46c, and the sheet-like material 46c may be stuck to the laminate 46b by the adhesive to prepare the piezoelectric laminate 12. Various adhesives capable of sticking the upper electrode 24 to the piezoelectric body layer 20 can be used according to the materials forming the upper electrode 24 and the piezoelectric body layer 20. Further, a material (that is, a binder) serving as the viscoelastic matrix 36 of the piezoelectric body layer 20 can also be used as the adhesive.

In the present embodiment, after the laminate 46b is cut into a predetermined shape, and the sheet-like material 46c, in which the upper electrode 24 is formed on the upper protective layer 26, is cut into a predetermined shape, the cut laminate 46b and the cut sheet-like material 46c are subjected to thermocompression bonding. However, the preparation of the piezoelectric laminate 12 is not necessarily performed in this order. For example, the laminate 46b and the sheet-like material 46c cut into a predetermined shape may be subjected to thermocompression bonding, and then, the laminate 46b may be cut into a predetermined shape.

In the converter film of the present invention, the piezoelectric laminate is not limited to the configuration illustrated in FIG. 4C in which the piezoelectric body layer 20, the lower electrode 30, and the lower protective layer 32 have the same size, and the upper electrode 24 and the upper protective layer 26 are slightly smaller than the piezoelectric body layer 20, the lower electrode 30, and the lower protective layer 32.

For example, all of the upper electrode 24, the upper protective layer 26, the piezoelectric body layer 20, the lower electrode 30, and the lower protective layer 32 may have the same size. Alternatively, the upper electrode 24, the upper protective layer 26, and the piezoelectric body layer 20 may have the same size, and the lower electrode 30 or the lower protective layer 32 may be slightly smaller than the upper electrode 24, the upper protective layer 26, and the piezoelectric body layer 20.

Furthermore, the upper protruded island portion 40 and the lower protruded island portion 42 may be formed on different sides of the piezoelectric laminate, as described above.

Various preparation methods can be used for preparing the piezoelectric laminate illustrated in FIG. 4C in which the lower protective layer 32, the lower electrode 30, the piezoelectric body layer 20, the upper electrode 24, and the upper protective layer 26 are laminated, and the upper protruded island portion 40 and the lower protruded island portion 42 are included.

For example, as the method of preparing the piezoelectric laminate, a method schematically shown in FIGS. 5A to 5C is exemplified.

In the preparation method, a sheet-like material 124a in which the upper electrode 24 is formed on one surface of the upper protective layer 26, and a separator 120 is stuck onto the other surface thereof is prepared. Further, a sheet-like material 124b in which the lower electrode 30 is formed on one surface of the lower protective layer 32, and a separator 126 is stuck onto the other surface thereof is prepared. The piezoelectric body layer 20 is formed on the surface of the lower electrode 30 of the sheet-like material 124b, as described above.

Furthermore, in a state where the upper electrode 24 faces the piezoelectric body layer 20, the sheet-like material 124a is stuck to the piezoelectric body layer 20 as described above, thereby preparing a laminate 128 illustrated in FIG. 5A.

As described above, the separator 120 and the separator 126 support the upper protective layer 26 and the lower protective layer 32, respectively.

In the preparation method of a piezoelectric laminate shown below, when the insulating sheet 14 is provided, similar to FIG. 4B, the insulating sheet 14 may be arranged at a position corresponding to the upper protruded island portion 40 before the sheet-like material having the upper electrode 24 and the upper protective layer 26 is laminated thereon.

Here, as illustrated in FIG. 5A, both of the sheet-like material 124a and the sheet-like material 124b are larger (have a larger area) than the piezoelectric body layer 20. Further, in the laminate 128, the piezoelectric body layer 20 is interposed between both the sheet-like materials.

Moreover, as illustrated in FIG. 5A, the sheet-like material 124a and the sheet-like material 124b are the same sheet-like materials except that the thickness of the separator is different, and an end portion of one side of the sheet-like material 124a extends in the same direction as that of the sheet-like material 124b. In the sheet-like material 124a, the upper electrode 24 is not formed in a region of a predetermined width, and also in the sheet-like material 124b, the lower electrode 30 is not formed in a region of a predetermined width. In the laminate 128, the sheet-like material 124a and the sheet-like material 124b are laminated such that the positions of their non-electrode formation regions are reversed to one another.

Then, the separator 120 and the separator 126 are peeled off and, for example, as indicated by the dotted line b in FIG. 5B, the laminate 128 from which the separators have been peeled off is cut according to a shape of the piezoelectric laminate to be prepared.

Cutting of the laminate 128 is performed such that the upper protruded island portion 40 is formed on the opposite side of the region, in which the upper electrode 24 is not formed, of the sheet-like material 124a, and the lower protruded island portion 42 is formed on the opposite side of the region, in which the lower electrode 30 is not formed, of the sheet-like material 124b.

Finally, the piezoelectric body layer 20 is removed from the regions in which the piezoelectric body layer 20 is unnecessary. The removal of the piezoelectric body layer 20 may be performed as described above. Further, unnecessary regions of the upper protective layer 26 and the upper electrode 24 are cut, and unnecessary regions of the lower protective layer 32 and the lower electrode 30 are cut.

Accordingly, the piezoelectric laminate illustrated in FIG. 5C in which the lower protective layer 32, the lower electrode 30, the piezoelectric body layer 20, the upper electrode 24, and the upper protective layer 26 are laminated, and the upper protruded island portion 40 and the lower protruded island portion 42 are included is prepared.

As another example of the method of preparing the piezoelectric laminate, a method schematically illustrated in FIGS. 6A to 6D is exemplified.

Also in this preparation method, a sheet-like material 124c in which the upper electrode 24 is formed on one surface of the upper protective layer 26 and the separator 120 is stuck onto the other surface thereof is prepared. Further, a sheet-like material 124d in which the lower electrode 30 is formed on one surface of the lower protective layer 32 and the separator 126 is stuck onto the other surface thereof is prepared. The piezoelectric body layer 20 is formed on the surface of the lower electrode 30 of the sheet-like material 124d, as described above.

Figure 6A:
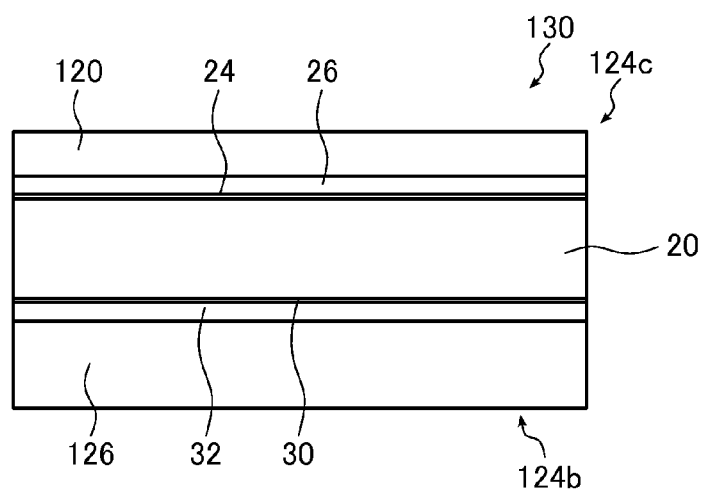
FIGS. 6A to 6D are conceptual views explaining another example of a method of preparing the electroacoustic converter film of the present invention.

Furthermore, in a state where the upper electrode 24 faces the piezoelectric body layer 20, the sheet-like material 124c is stuck to the piezoelectric body layer 20 as described above, thereby preparing a laminate 130 illustrated in FIG. 6A.

In the laminate 130, the electrode of each sheet-like material is formed on the entire surface of the protective layer. Further, the sheet-like material 124c, the piezoelectric body layer 20, and the sheet-like material 124d have the same size.

Figure 6B:
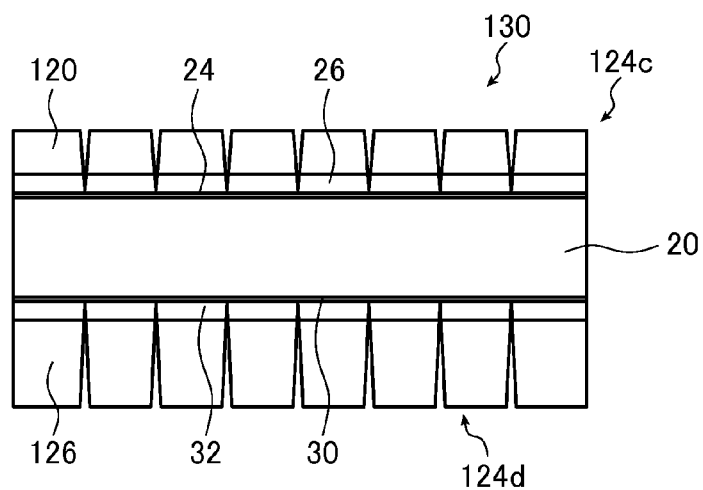
Figure 6C:
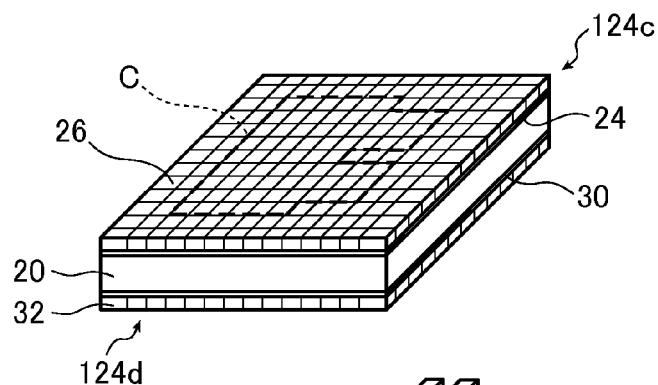

Then, as illustrated in FIG. 6B, grid-like notches are made into the separator 120 and the upper protective layer 26 of the sheet-like material 124c, as well as the separator 126 and the lower protective layer 32 of the sheet-like material 124d at predetermined intervals (see FIG. 6C). The intervals of the grids may be appropriately set according to the size, the shape, or the like of the piezoelectric laminate to be intended.

As the method of making the notches into the laminate 130, various methods can be used according to the materials forming the sheet-like material 124c and the sheet-like material 124d.

As a preferable method, a method using a laser is exemplified.

According to the examination conducted by the present inventors, a laser beam having a wavelength of 10.6 μm emitted from a carbon dioxide gas laser is absorbed by a resin or a metal oxide and reflected (not absorbed) by a metal. Further, in general, the separator and the protective layer are formed of a PET resin, and the electrode is formed of a metal such as copper. Therefore, when the sheet-like material 124c and the sheet-like material 124d are scanned in a grid pattern by the laser beam having a wavelength of 10.6 μm emitted from the carbon dioxide gas laser, only the separator and the protective layer can be removed by ablation without damaging the electrodes, and the notches can be made into the sheet-like material 124c and the sheet-like material 124d in a grid pattern.

Then, the separator 120 and the separator 126 are peeled off and, for example, as indicated by the dotted line c in FIG. 6C, the laminate 128 from which the separator has been peeled off is cut according to the shape of the piezoelectric laminate to be prepared.

Figure 6D:
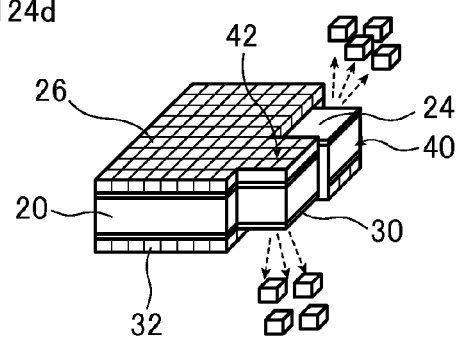

Furthermore, as illustrated in FIG. 6D, the upper protective layer 26 on the upper protruded island portion 40 is removed along the notches so as to expose the upper electrode 24 in this position. Further, the lower protective layer 32 on the lower protruded island portion 42 is removed along the notches so as to expose the lower electrode 30 in this position.

Accordingly, the piezoelectric laminate illustrated in FIG. 6D in which the lower protective layer 32, the lower electrode 30, the piezoelectric body layer 20, the upper electrode 24, and the upper protective layer 26 are laminated, and the upper protruded island portion 40 and the lower protruded island portion 42 are included is prepared.

As another example of the method of preparing the piezoelectric laminate, a method schematically illustrated in FIGS. 7A to 7F is exemplified.

Also in this preparation method, as shown on the left side of FIG. 7A, a sheet-like material 124e in which the upper electrode 24 is formed on one surface of the upper protective layer 26, and the separator 120 is stuck onto the other surface thereof is prepared. Further, a sheet-like material in which the lower electrode 30 is formed on one surface of the lower protective layer 32, and the separator 126 is stuck onto the other surface thereof is prepared. Furthermore, the piezoelectric body layer 20 is formed on the surface of the lower electrode 30 of the sheet-like material 124e as described above, thereby preparing a laminate 124f.

Then, as shown on the right side of FIG. 7A, in a state where the upper electrode 24 faces the piezoelectric body layer 20, the sheet-like material 124e and the laminate 124f are laminated and bonded together to prepare a laminate 132.

Here, in the laminate 132, the sheet-like material 124e (upper electrode 24) is bonded to the piezoelectric body layer 20, such that the adhesive strength thereof in a predetermined region a near the end portion of a predetermined side is weaker than those of other regions over the entire area in an extending direction of the side.

In the preparation method of the piezoelectric laminate, the upper protruded island portion 40 is formed so as to correspond to the region a. Therefore, the width of the region a may be appropriately set according to the size of the upper protruded island portion 40 to be intended, but the width is preferably approximately 2 cm to 100 cm.

As a method of obtaining the adhesive strength of the region a that is weaker than those of other regions in the laminate 132, various methods can be used according to a method of bonding the sheet-like material 124e and the laminate 124f together (that is, a method of bonding the upper electrode 24 and the piezoelectric body layer 20 together).

For example, when the sheet-like material 124e and the laminate 124f are bonded together by using an adhesive, a method in which the adhesive is not applied to the region a, or a method in which the amount of the adhesive is reduced in the region a is exemplified. Alternatively, when the sheet-like material 124e and the laminate 124f are bonded together by using an adhesive, a method in which a film having low adhesive strength to the adhesive used is laminated on the region a beforehand, and the film is removed after the adhesive is cured can be used.

Furthermore, when the sheet-like material 124e and the laminate 124f are bonded together through thermocompression bonding, a method in which temperature and/or pressure of a region corresponding to the region a is lowered is exemplified. Alternatively, when the sheet-like material 124e and the laminate 124f are bonded together through thermocompression bonding, a method in which a film having low thermocompression bonding strength to the upper electrode 24 and the piezoelectric body layer 20 is laminated on the region a beforehand, and the film is removed after the thermocompression bonding can be used.

The laminate 132 may be prepared by using so-called Roll to Roll.

In this case, a transport direction of the sheet-like material 124e and the laminate 124f matches an extending direction of the region a of which the adhesive strength is weak (a direction indicated by arrow a). That is, when the Roll to Roll is used, the region a extends in a longitudinal direction of the sheet-like material 124e, and is formed in one end portion in a width direction thereof.

The aforementioned laminate 128 or 130, and further the laminate shown in FIG. 3E may also be prepared by using the Roll to Roll.

Then, as illustrated in FIGS. 7B and 7C, the region a side of the sheet-like material 124e is cut according to the position and the shape of the upper protruded island portion 40 in the upper electrode 24 and the upper protective layer 26, for example, as indicated by the dashed line b, and then, the separator 120 is peeled off.

As described above, the adhesive strength of the region a is low. Accordingly, the cutting of the sheet-like material 124e can easily be performed by lifting the region a of the sheet-like material 124e.

Thereafter, as illustrated in FIGS. 7D and 7E, the region a side of the laminate 124f is cut according to the position and the shape of the lower protruded island portion 42 in the lower electrode 30 and the lower protective layer 32, for example, as indicated by the dashed line d.

As described above, the adhesive strength of the region a is low. Accordingly, the cutting of the laminate 124f can easily be performed by lifting the region a of the laminate 124f.

Furthermore, as illustrated in FIG. 7F, the piezoelectric body layer 20 laminated on the lower electrode 30 of the lower protruded island portion 42 is removed to expose the lower electrode 30, and then, the separator 126 is peeled off. The removal of the piezoelectric body layer 20 may be performed as described above.

Accordingly, the piezoelectric laminate illustrated in FIG. 7F in which the lower protective layer 32, the lower electrode 30, the piezoelectric body layer 20, the upper electrode 24, and the upper protective layer 26 are laminated, and the upper protruded island portion 40 and the lower protruded island portion 42 are included is prepared.

In the above examples, in order to lead out the electrodes, the piezoelectric body layer 20 is removed by using a solvent or the like to expose the upper electrode 24 and/or the lower electrode 30.

However, in the present invention, in order to lead out the electrodes, the upper protective layer 26 and/or the lower protective layer 32 rather than the piezoelectric body layer 20 may be removed to expose the upper electrode 24 and/or the lower electrode 30. As the method of removing the upper protective layer 26 and/or the lower protective layer 32, removal thereof by using a solvent or a mechanical machining process can be used.

Here, as described above, generally, the protective layer is a resin such as PET, and the electrode is a metal such as copper. Further, if a laser beam having a wavelength of 10.6 μm emitted from a carbon dioxide gas laser is used, only the protective layer can be removed by ablation without damaging the electrode. Therefore, a method of exposing the upper electrode 24 and/or the lower electrode 30 by removing the upper protective layer 26 and/or the lower protective layer 32 using the laser beam is preferably exemplified.

For example, in the steps of FIGS. 7E to 7F, the separator 126 is peeled off without removing the piezoelectric body layer 20 laminated on the lower protruded island portion 42. Then, the lower protective layer 32 of the lower protruded island portion 42 is irradiated with the laser beam having a wavelength of 10.6 μm emitted from a carbon dioxide gas laser (the lower protruded island portion 42 is irradiated with the laser beam from a lower side in FIGS. 7E to 7F). Accordingly, the protective layer 32 of the lower protruded island portion 42 can be removed by the laser beam, and thus, the lower electrode 30 can be exposed.

After the piezoelectric laminate 12 is prepared as above, as illustrated in FIGS. 1, 2B and 2C, the upper metal foil 16 is laminated on the upper electrode 24 (upper electrode lead-out portion 24a) of the upper protruded island portion 40, and as necessary, is folded back so as to sandwich the upper electrode 24 and the upper protective layer 26 from both sides.

Furthermore, the lower metal foil 18 is laminated on the lower electrode 30 (lower electrode lead-out portion 30a) of the lower protruded island portion 42, and as necessary, is folded back so as to sandwich the lower electrode 30 and the lower protective layer 32 from both sides, thereby completing the converter film 10 of the present invention illustrated in FIGS. 1, 2B, and 2C. The lower metal foil 18 is laminated on the lower protruded island portion 42 such that the end portion of the lower metal foil 18 reaches an inward region beyond the lower protruded island portion 42 in which the lower electrode 30 has been exposed as described above, or is further folded back.

As illustrated in FIG. 1, in the converter film 10, the piezoelectric body layer 20 is exposed around the upper protective layer 26. Therefore, as conceptually illustrated in FIG. 8A, in the converter film 10, it is preferable to provide a side surface insulating layer 60 which covers the piezoelectric body layer 20 in end portions of the upper protective layer 26 (upper electrode 24) and around the upper protective layer 26.

By providing the side surface insulating layer 60, it is possible to prevent an electric shock or the like caused by a user touching the end portions of the upper electrode 24.

The side surface insulating layer 60 may be formed of various materials having insulating properties, and specifically, the materials exemplified in the aforementioned insulating sheet 14 are suitably exemplified. Among them, polyimide is preferably used.

As the attachment method of the side surface insulating layer 60, various known attachment methods of a sheet-like material can be used according to the material forming the side surface insulating layer 60.

Figure 8A:
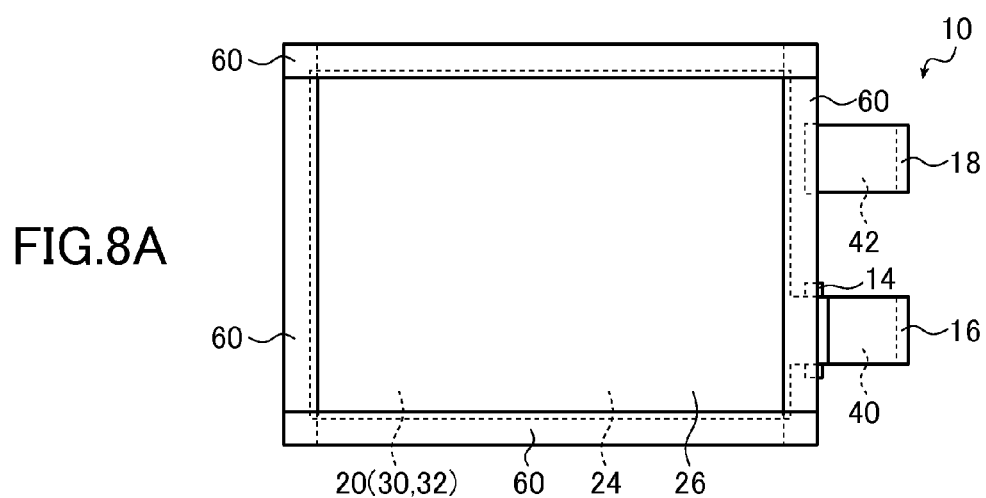
FIGS. 8A to 8C are views conceptually illustrating another example of the electroacoustic converter film of the present invention.

In FIG. 8A, the upper protective layer 26 and the piezoelectric body layer 20 around the upper protective layer 26 are covered with the four strip-like side surface insulating layers 60, but other than the side surface insulating layer 60 illustrated in the drawing, various shapes, such as a frame shape, can be used.

In order to facilitate mounting of the converter film 10 on a speaker or the like as illustrated in FIG. 10F or the like to be described later, it is preferable to provide sheet-like tab 62 which extends in the same direction as a side of the converter film 10, covers the side surface insulating layer 60, and protrude to the outside of the converter film 10, as conceptually illustrated in FIG. 8B. The tab 62 may be provided such that the converter film 10 is sandwiched between the upper and lower surfaces of the tab.

Accordingly, it becomes possible to handle the converter film 10 by using the tab 62, and at the time of mounting the converter film 10, the converter film 10 can be pulled in a surface direction and mounted in an appropriate state with no wrinkles or the like. Further, an extra portion of the tab 62 may be cut after the converter film 10 is mounted on the speaker or the like.

The tab 62 may also be formed of various materials having insulating properties. Specifically, the materials exemplified in the aforementioned insulating sheet 14 are suitably exemplified. Among them, the polyimide is preferable.

As the attachment method of the tab 62, various known attachment methods of a sheet-like material can be used according to the material forming the tab 62. Further, as the side surface insulating layer 60, various shapes, such as a frame shape, can be used for the tab 62.

In addition to the configuration in which the tabs 62 are provided such that each tab extends over the entire region of each of the sides of the converter film 10 as in the illustrated example, the tab 62 may be provided, for example, as a partially protruding convex portion, like the upper protruded island portion 40 and the lower protruded island portion 42.

The converter film 10 of the present invention has the upper protective layer 26 on the surface thereof. However, as described above, the upper protective layer 26 is a thin film, and thus, the strength thereof is insufficient in some cases.

Figure 8B:
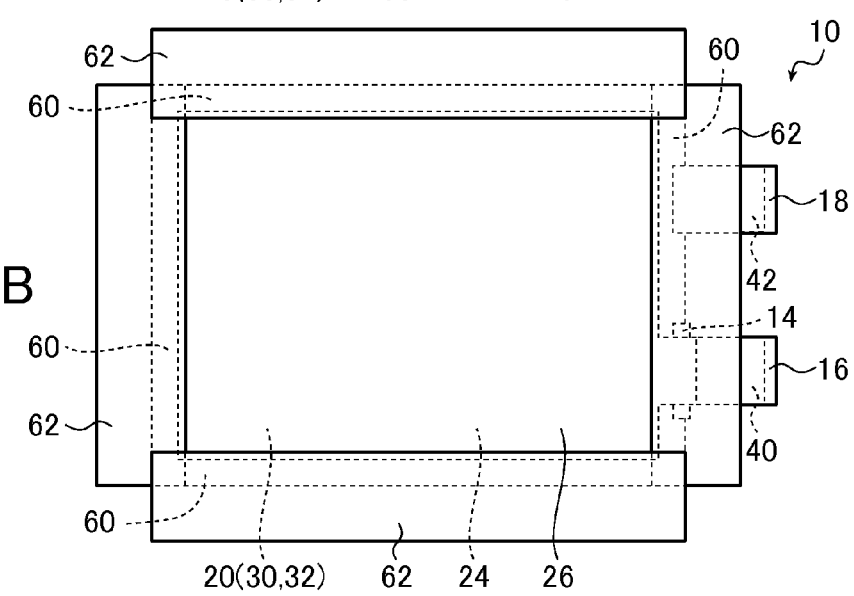
Figure 8C:
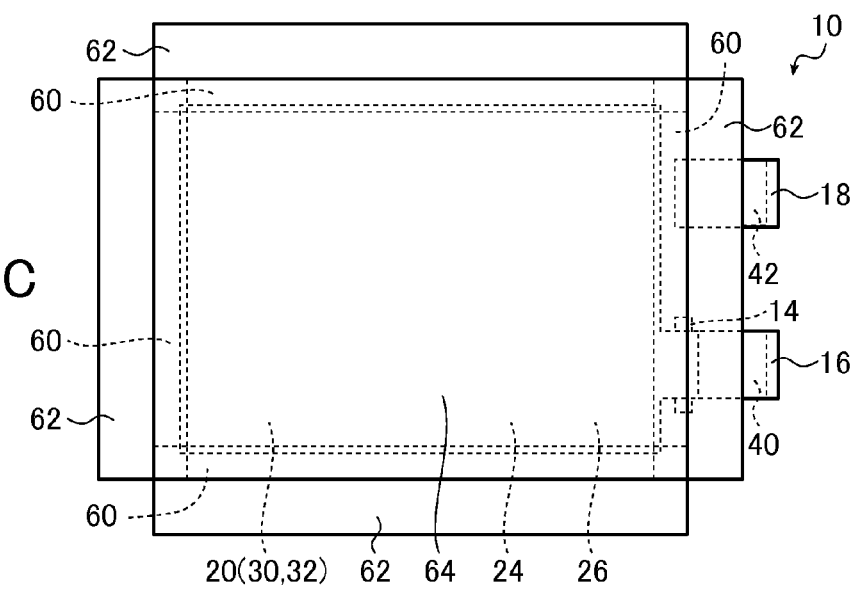

In a case where the strength of the upper protective layer 26 is insufficient, as illustrated in FIG. 8C, a second upper protective layer 64 may be provided so as to cover the entire surface of the upper protective layer 26, and thereby the strength of the converter film 10 can be further improved.

As the material forming the second upper protective layer 64, the materials exemplified in the aforementioned upper protective layer 26 are suitably exemplified. In particular, insulating materials such as PET, PEN, PI, and PP are preferable.

As the attachment method of the second upper protective layer 64, various known attachment methods of a sheet-like material can be used, according to the material forming the second upper protective layer 64.

In a case in which the second upper protective layer 64 is too thick, the second upper protective layer 64 may adversely affect the flexibility or acoustic characteristics of the converter film 10. Considering this point, the thickness of the second upper protective layer 64 is preferably 12 μm to 100 μm, and particularly preferably 12 μm to 40 μm.

Furthermore, if necessary, the converter film of the present invention may be provided with a second lower protective layer covering the entire surface of the lower protective layer 32. That is, the converter film may be interposed between two second protective layers.

Figure 15:
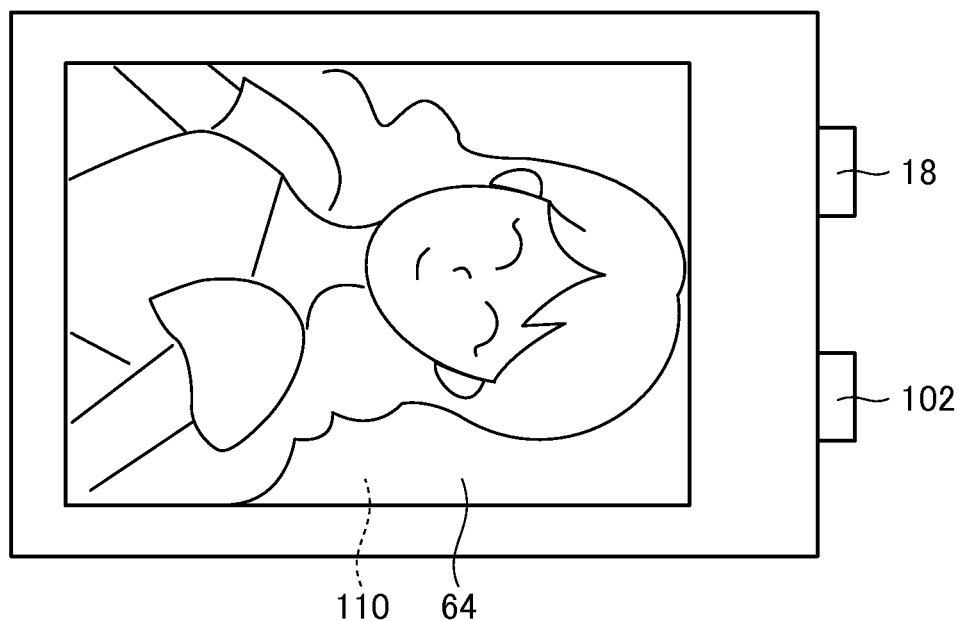
FIG. 15 is a view conceptually illustrating another example of the electroacoustic converter film of the present invention.

As illustrated in FIG. 15 to be described later, a photograph, a thin organic EL display, or the like may be inserted between the second upper protective layer 64 and the upper protective layer 26.

In an example illustrated in FIGS. 8A to 8C, the side surface insulating layer 60, the tab 62, and the second upper protective layer 64 are separate members. However, in the converter film 10 of the present invention, in addition to them, a variety of configurations can be used.

Figure 9A:
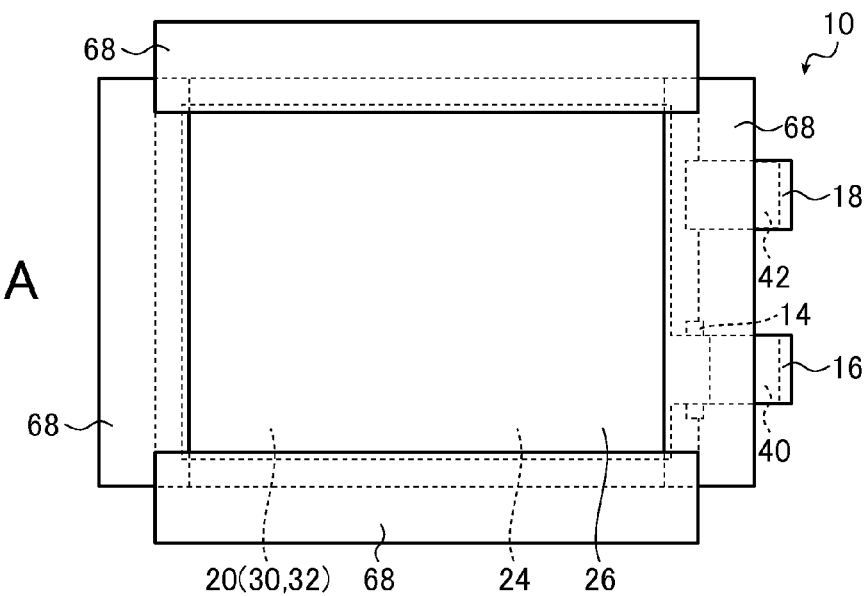
FIGS. 9A and 9B are views conceptually illustrating another example of the electroacoustic converter film of the present invention.

For example, as conceptually illustrated in FIG. 9A, a sheet-like material 68 which serves as the side surface insulating layer and the tab may be provided. The sheet-like material 68 covers the piezoelectric body layer 20 in the end portions of the upper protective layer 26 (upper electrode 24) and around the upper protective layer 26, and protrudes to the outside of the converter film 10. The sheet-like material 68 may be provided such that the converter film 10 is sandwiched between the surfaces of the sheet-like material 68, as the tab 62 described above.

Figure 9B:
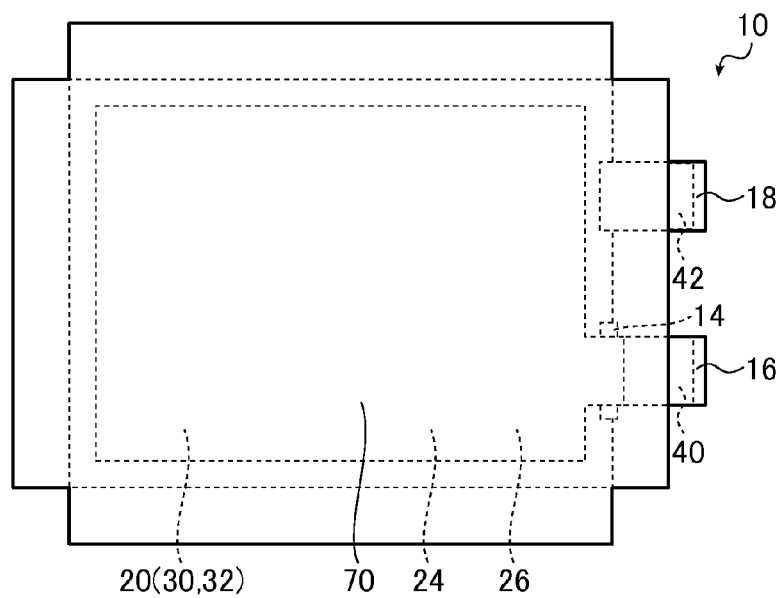

Alternatively, as conceptually illustrated in FIG. 9B, a sheet-like material 70 which serves as the second upper protective layer, the side surface insulating layer, and the tab may be provided. The sheet-like material 70 covers the upper protective layer 26 and the piezoelectric body layer 20 around the upper protective layer 26, and protrudes to the outside of the converter film 10. Further, the converter film 10 may be sandwiched between the surfaces of the sheet-like material 70.

FIGS. 10A to 10F conceptually illustrate a thin type speaker on which the converter film 10 with the tab 62 of the present invention is mounted, and a preparation method thereof.

First, as illustrated in FIGS. 10A and 10B, a support 76 that supports the converter film 10 is accommodated in a chassis 74 such as a rectangular parallelepiped having one open surface. The support 76 has a thickness such that the support 76 protrudes to an upper side of the chassis 74.

The support 76 supports the converter film 10 and applies a constant mechanical bias in any location of the piezoelectric film such that the expansion and contraction movement of the converter film 10 is completely converted into forward and backward movement (movement performed in the direction perpendicular to the film surface). Examples of the support 76 include non-woven fabrics such as wool felt and rayon- or PET-containing wool felt, glass wool, and the like.

Then, as conceptually illustrated in FIG. 10C, the converter film 10 is placed on the support 76 so as to cover the entire surface of the support 76.

After the converter film 10 is placed, the converter film 10 and the chassis 74 are covered with a press lid 78 having a shape corresponding to the chassis 74 from above, as illustrated in FIG. 10D. Here, the press lid 78 has a shape that abuts a top surface of the chassis 74 and an outer side surface (outer circumferential surface) of the chassis 74 other than an accommodating portion that accommodates the support 76. Accordingly, the support 76 is pressed by the converter film 10, and a constant mechanical bias described above is applied to the converter film 10.

At this time, by pulling the tab 62, it is possible to prevent the converter film 10 from wrinkling and to finely mount the converter film 10 through simple work.

The extra tab 62 protruding from the chassis 74 may be cut.

After the converter film 10 and the chassis 74 are covered with the press lid 78, the chassis 74 and the press lid 78 are fixed by screws 80, as illustrated in FIG. 10E. Further, as illustrated in FIG. 10F, wiring 82 is connected by a solder 82a, and the thin speaker 84 on which the converter film 10 of the present invention is mounted is obtained.

Here, the upper protruded island portion 40 and the lower protruded island portion 42 are bent twice, but there is no need to worry about disconnection or the like, since the upper protruded island portion 40 and the lower protruded island portion 42 are reinforced by the upper metal foil 16 and the lower metal foil 18. Further, even when the upper electrode 24 or the lower electrode 30 is disconnected due to such bending, conductivity can be ensured by the upper metal foil 16 and the lower metal foil 18.

The mechanical strength of the region, in which the upper metal foil 16 is spaced apart from the piezoelectric body layer 20, and only the upper electrode 24 and the upper protective layer 26 are included, is low. However, this does not cause a problem, because the converter film 10 is rarely taken out from the thin type speaker 84 after the speaker is once assembled.

Figure 11A:
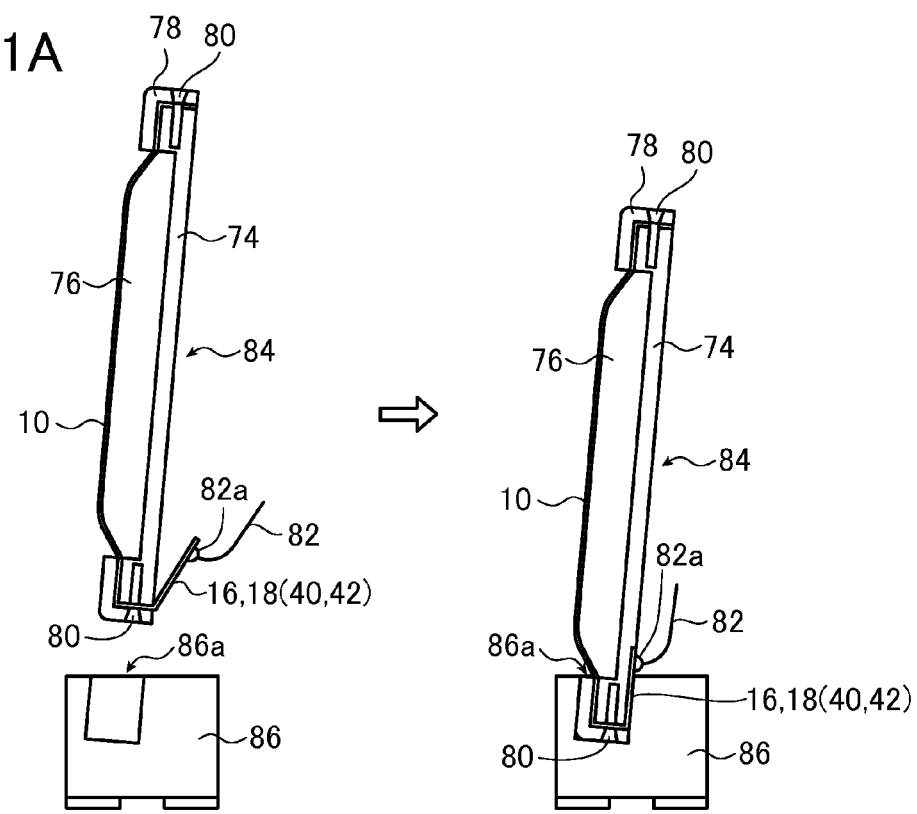
FIGS. 11A and 11B are views conceptually illustrating an example of a method of using the thin type speaker illustrated in FIGS. 10A to 10F.

As schematically illustrated in FIG. 11A, such a thin type speaker 84 may be loaded on a stand 86 having an insertion portion 86a into which the thin type speaker 84 is inserted, and used.

Figure 11B:
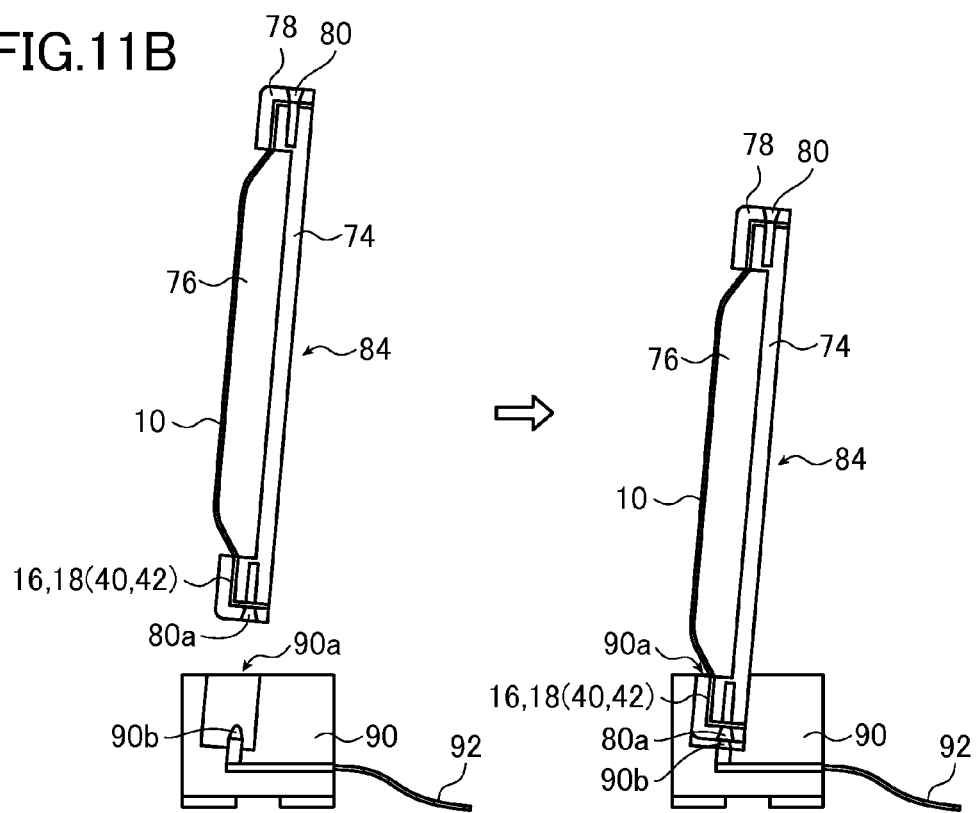

Alternatively, screws 80a are provided at a position in which the screw 80a passes through the upper metal foil 16 and at a position in which the screw 80a passes through the lower metal foil 18, respectively. Then, as conceptually illustrated in FIG. 11B, an engaging portion 90b that engages with the screw 80a when the thin type speaker 84 is inserted into an insertion portion 90a of the stand 90 on which the thin type speaker 84 is loaded is provided. Further, wiring 92 is connected to the engaging portion 90b.

Thus, when the thin type speaker 84 is loaded on the stand 90, the converter film 10 can be electrically connected to the wiring 92, as in a so-called cradle for charging a mobile phone.

FIGS. 12 and 13 conceptually illustrate another aspect of the converter film of the present invention. FIG. 13 is a cross-sectional view taken along X-X of FIG. 12.

Since a converter film 100 illustrated in FIGS. 12 and 13 has the same configuration as the above-described converter film 10 except that an upper metal foil 102 is inserted between the upper electrode 24 and the insulating sheet 14, the same members are denoted with the same reference numerals and different portions will be mainly described thereinafter.

As described above, the upper metal foil 16 is spaced apart from the piezoelectric body layer 20, and the converter film 10 has a region in which only the upper electrode 24 and the upper protective layer 26 are included between the upper metal foil 16 and the piezoelectric body layer 20. The mechanical strength of the region in which only the upper electrode 24 and the upper protective layer 26 are included is low. However, this does not cause a problem, because the converter film 10 is mainly used in a fixed state, as in the thin type speaker 84 illustrated in FIGS. 10F, 11A, and 11B.

Figure 14:
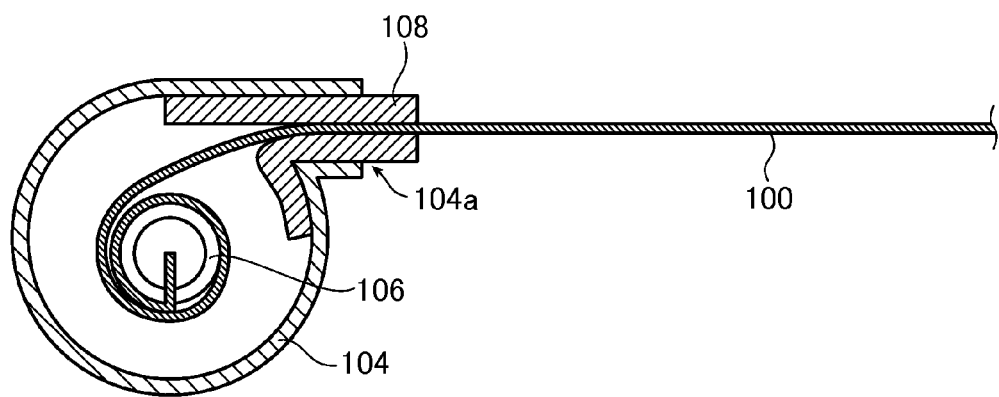
FIG. 14 is a view conceptually illustrating an example of a winding type speaker using the electroacoustic converter film illustrated in FIG. 12.

In contrast, the converter film 100 illustrated in FIGS. 12 and 13 is applied to a winding type speaker conceptually illustrated in FIG. 14. Therefore, when the lead-out portion of the upper electrode 24 includes such a portion having low mechanical strength, the upper electrode 24 is disconnected in the portion, and the converter film does not operate.

In response to the above, the converter film 100 illustrated in FIGS. 12 and 13 has a configuration in which the upper metal foil 102 is elongated, the end portion thereof extends up to a region in which the upper metal foil 102 is laminated (overlapped) on the piezoelectric body layer 20, and the upper metal foil 16 is sandwiched between the insulating sheet 14 and the upper electrode 24.

Accordingly, the region in which only the upper electrode 24 and the upper protective layer 26 are included, as in the converter film 10 illustrated in FIGS. 1, 2B and 2C, is not present in the electrode lead-out portion from the upper electrode 24, and the entire region of the electrode lead-out portion from the upper electrode 24 can be reinforced by the upper metal foil 16.

Therefore, in the converter film 100, even when bending and stretching, winding and unwinding, or the like are performed on the electrode lead-out portion many times, the upper electrode 24 can be prevented from being disconnected. Further, even if the upper electrode 24 is disconnected in the electrode lead-out portion from the upper electrode 24, conductivity can be ensured by the upper metal foil 102.

Such a converter film 100 can be basically prepared by the method shown in FIGS. 3A to 3E and FIGS. 4A to 4C, or the like, as the above-described converter film 10.

Here, as described above, in the converter film 100, the end portion of the upper metal foil 102 is extended up to a position in which the end portion is laminated on the piezoelectric body layer 20, and sandwiched between the insulating sheet 14 and the upper electrode 24. Therefore, at the time of preparing the converter film 100, before the sheet-like material 46c, in which the upper electrode 24 and the upper protective layer 26 are laminated, is laminated on the laminate 46b, in which the lower protective layer 32, the lower electrode 30, and the piezoelectric body layer 20 are laminated, as illustrated in FIG. 3E, the upper metal foil 102 may be laminated on the upper electrode 24, and thereafter, lamination and thermocompression bonding of the laminate 46b and the sheet-like material 46c may be performed.

At the time of thermocompression bonding, only the upper protruded island portion 40 is likely to sink into the piezoelectric body layer 20 by the thickness of the upper metal foil 102. However, since the insulating sheet 14 is always inserted between the upper metal foil 102 and the piezoelectric body layer 20, short-circuit between the upper electrode 24 and the lower electrode 30 can be reliably prevented.

As described above, the converter film 100 is suitably used for the winding type speaker illustrated in FIG. 14.

In an example illustrated in FIG. 14, the converter film 100 is wound and accommodated in a case 104 like a cartridge for a photographic film. A cylindrical winding shaft 106 is rotatably supported in the case 104.

In an outlet portion 104a for loading and unloading the converter film 100 into and from the case 104, a guide member 108 for smoothly performing loading and unloading of the converter film 100 and preventing the converter film 100 from being damaged due to loading and unloading is provided so as to sandwich the converter film 100 from the both sides. This guide member 108 is formed of, for example, felt or the like.

In the converter film 100, the end portion on the side in which the upper protruded island portion 40 or the like is formed (hereinafter also referred to as a proximal end) is fixed to the winding shaft 106. As described above, since the winding shaft 106 has a cylindrical shape, two pieces of wiring connected to the upper metal foil 102 and the lower metal foil 18 are led out from the winding shaft 106.

Furthermore, the end portion on the side opposite to the proximal end of the converter film 100 is provided with a handle portion (not shown) that is larger than the outlet portion 104a, and the handle portion prevents the converter film 100 from completely entering into the case 104.

Accordingly, by rotating the winding shaft 106, the converter film 100 can be accommodated in the case 104, and by pulling the handle portion, the converter film 100 can be pulled out from the case 104.

The vicinity of the end portion on the proximal end side of the converter film 100 is subjected to bending and stretching at high curvature many times. However, as described above, in the lead-out portion of the upper electrode 24 of the converter film 100, the end portion of the upper metal foil 102 extends up to the position in which the end portion is laminated on the piezoelectric body layer 20, and sandwiched between the insulating sheet 14 and the upper electrode 24, and accordingly, it is possible to prevent the upper electrode 24 from being disconnected in the electrode lead-out portion.

When such a converter film 100 is mounted on the winding type speaker, the proximal end side is not discharged from the case 104. That is, in the converter film 100, the region on the proximal end side does not need to operate as a speaker or the like.

Therefore, in the converter film 100, the interval between the end portion on the proximal end side and the upper electrode (and the upper protective layer 26) is set long, as illustrated in FIG. 12.

In the converter film 100, the side surface insulating layer 60 or the second upper protective layer 64 may also be provided, as in the aforementioned example. Furthermore, the sheet-like material serving as both of the side surface insulating layer 60 and the second upper protective layer 64 may also be provided in the converter film 100. Moreover, in addition to the second upper protective layer, the second lower protective layer may be provided, and the converter film 100 may be interposed between the two second protective layers.

In the converter film 100 used for a winding type speaker, wrinkle smoothing or the like does not need to be performed when the converter film 100 is mounted, and accordingly, the tab 62 is not necessary.

When the second upper protective layer 64 is provided, an image medium 110 such as a photograph or a thin organic EL display may be provided between the second upper protective layer 64 and the upper protective layer 26, as schematically illustrated in FIG. 15.

Accordingly, the designability and entertainability of the converter film 100 can be improved. The same applies to the converter film 10 illustrated in FIGS. 1 and 2A to 2C, as described above.

In the above examples, the upper protruded island portion 40 and the lower protruded island portion 42 that convexly protrude are provided in the converter film, and leading out of electrodes from the upper electrode 24 and the lower electrode 30 is performed through the upper protruded island portion 40 and the lower protruded island portion 42.

However, in the present invention, in addition to the above configuration, by using an upper metal foil (metal foil for upper lead-out) and a lower metal foil (metal foil for lower lead-out), leading out of electrodes from the upper electrode 24 and the lower electrode 30 can be performed in various configurations.

Figure 16A:
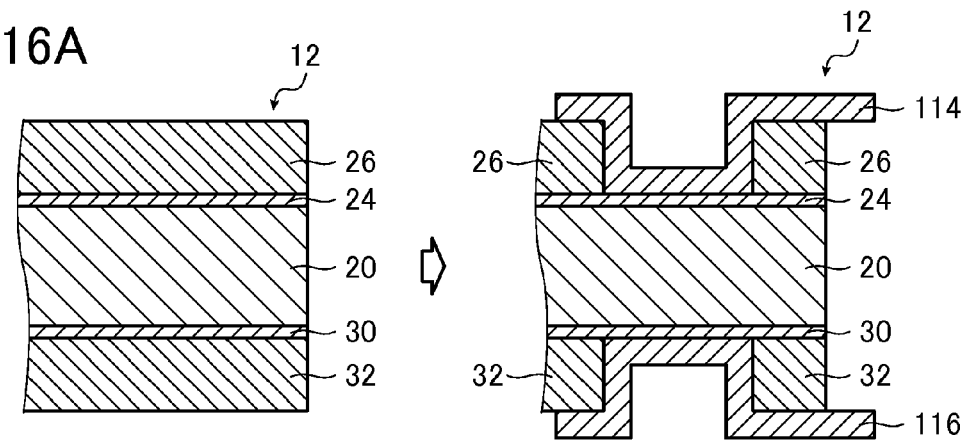
FIGS. 16A to 16D are conceptually illustrating another example of the electroacoustic converter film of the present invention.

For example, a configuration schematically shown in FIG. 16A is exemplified.

In the configuration, after the piezoelectric laminate 12 including the piezoelectric body layer 20, the upper electrode 24, the upper protective layer 26, the lower electrode 30, and the lower protective layer 32 is prepared, portions of the upper protective layer 26 and the lower protective layer 32 are removed to expose the upper electrode 24 and the lower electrode 30.

For example, if the upper protective layer 26 and the lower protective layer 32 are PETs, the upper protective layer 26 and the lower protective layer 32 can be removed using hexafluoroisopropanol or the like. Alternatively, the upper protective layer 26 and the lower protective layer 32 may be removed through mechanical grinding.

Alternatively, as described above, the upper protective layer 26 and the lower protective layer 32 may be removed using a laser beam having a wavelength of 10.6 μm emitted from a carbon dioxide gas laser. When the laser beam is used, the upper electrode 24 and the lower electrode 30 is less likely to be removed together with the upper protective layer 26 and the lower protective layer 32, which is preferable.

Then, an upper metal foil 114 and a lower metal foil 116 are provided so as to connect to the upper electrode 24 and the lower electrode 30 that have been exposed, and leading out of electrodes from the upper electrode 24 and the lower electrode 30 are performed using the metal foils. At this time, in order for electrical connection between the upper electrode 24 and the upper metal foil 114 and between the lower electrode 30 and the lower metal foil 116 to be maintained satisfactorily, it is preferable to perform the connection through a silver paste or a conductive adhesive.

According to this configuration, by providing the upper metal foil 114 and the lower metal foil 116, contact with the upper electrode 24 and contact with the lower electrode 30 can be simply achieved in the last step for the preparation of the converter film.

The configuration illustrated in FIG. 16A is not necessarily adopted with respect to both of the upper and lower electrodes. For example, only the upper electrode 24 may have the configuration illustrated in FIG. 16A, and the lower electrode 30 may have the aforementioned configuration illustrated in FIGS. 1 and 2C, or FIGS. 12 and 13.

Figure 16B:
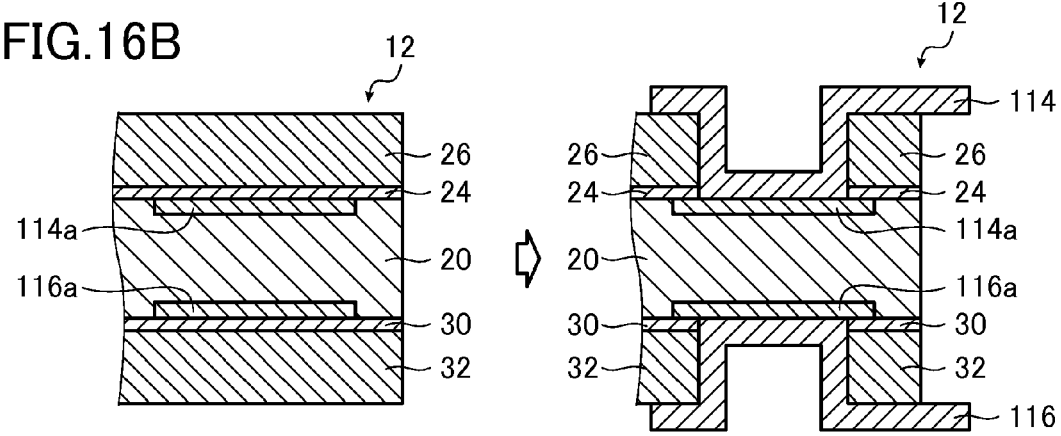
Figure 16C:
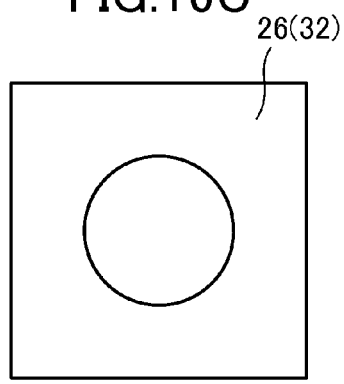

When through holes are formed in the upper protective layer 26 and the lower protective layer 32 to lead out the electrodes from the upper electrode 24 and the lower electrode 30, one through hole may be formed for one electrode lead-out portion to perform leading out of electrode, as illustrated in FIG. 16C.

Figure 16D:
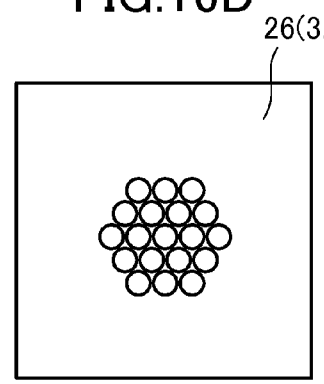

However, in the present invention, in addition thereto, a plurality of fine through holes may be arranged and formed for one electrode lead-out portion to perform leading out of electrode, as illustrated in FIG. 16D. By doing so, since the upper protective layer 26 and the lower protective layer 32 as supports remain, it is possible to prevent mechanical strength of the electrode lead-out portion from being degraded.

Here, as described above, the upper electrode 24 and the upper protective layer 26, as well as the lower electrode 30 and the lower protective layer 32 are thin films. Therefore, when the upper protective layer 26 and the lower protective layer 32 are removed, there is a possibility that the upper electrode 24 and the lower electrode 30 are also removed.

To eliminate the above possibility, as conceptually illustrated in FIG. 16B, when the piezoelectric laminate 12 is prepared, an auxiliary metal foil 114a and an auxiliary metal foil 116*a* may be provided between the piezoelectric body layer 20 and the upper electrode 24, and between the piezoelectric body layer 20 and the lower electrode 30, respectively, and the connections between the upper electrode 24 and the upper metal foil 114, and between the lower electrode 30 and the lower metal foil 116 may be performed at the positions of the auxiliary metal foils 114*a* and 116*a*, respectively.

As the converter film 10 or the like, the upper metal foil and the lower metal foil may be provided at the end portions of the piezoelectric laminate 12, and electrodes may be led out from the upper electrode 24 and the lower electrode 30.

Figure 17A:
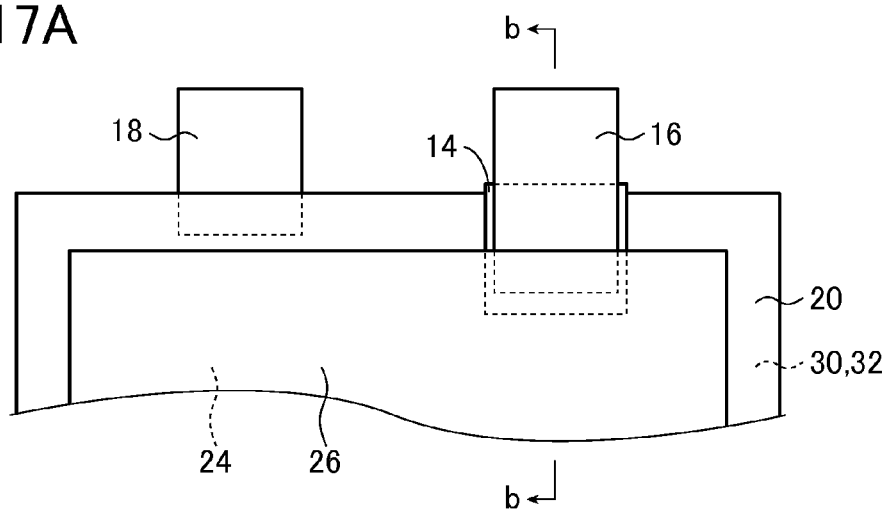
FIG. 17A is a view conceptually illustrating another example of the electroacoustic converter film of the present invention.
Figure 17B:
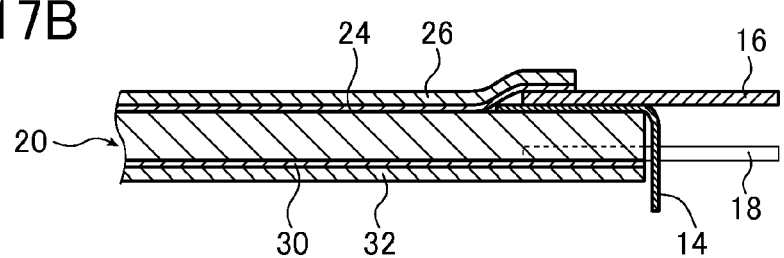
FIG. 17B is a view conceptually illustrating a cross section taken along the line b-b in FIG. 17A.

For example, as schematically illustrated in FIG. 17A, and FIG. 17B that is a cross-sectional view taken along the line b-b of FIG. 17A, the upper metal foil 16 may be inserted between the insulating sheet 14 and the upper electrode 24, and the lower metal foil 18 may be inserted between the piezoelectric body layer 20 and the lower electrode 30 without providing the upper protruded island portion and the lower protruded island portion for leading out the electrodes.

In this configuration, with respect to the lower metal foil 18, after the laminate 46*b* including the lower protective layer 32, the lower electrode 30, and the piezoelectric body layer 20 is prepared, a portion of the piezoelectric body layer 20 may be removed, and the lower metal foil 18 may be stuck to the portion from which the piezoelectric body layer 20 has been removed, as in the aforementioned examples.

On the other hand, with respect to the upper metal foil 16, as in the aforementioned converter film 100, before the sheet-like material 46*c* formed by laminating an upper electrode 24 and the upper protective layer 26 is laminated on the laminate 46*b*, as illustrated in FIG. 3E, the upper metal foil 16 may be laminated on the upper electrode 24, and then, lamination and thermocompression bonding of the laminate 46*b* and the sheet-like material 46*c* may be performed.

Furthermore, in the examples described above, the upper electrode 24 (upper protective layer 26) is smaller than the lower electrode 30 (lower protective layer 32), and the upper electrode 24 and the piezoelectric body layer 20 are laminated such that a margin of the piezoelectric body layer 20 is formed around the upper electrode 24.

However, in the present invention, the upper electrode 24 and the lower electrode 30 may have the same size, or the upper electrode 24 may be larger than the lower electrode 30.

Figure 18:
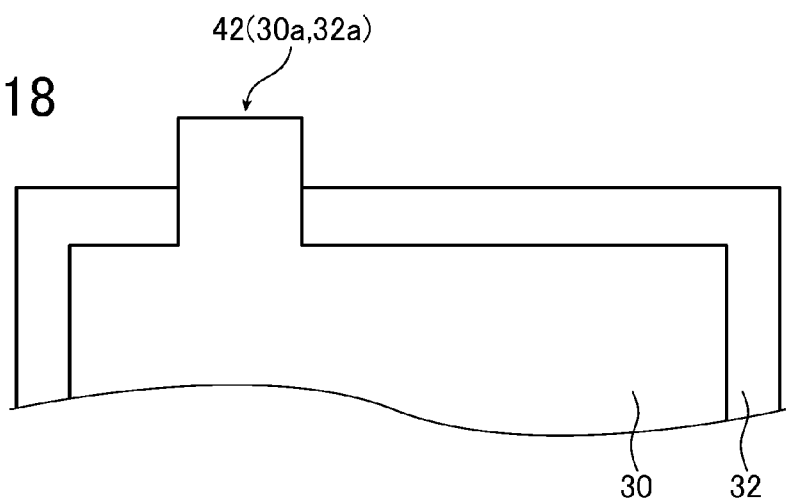
FIG. 18 is a conceptual view explaining a configuration of another example of the electroacoustic converter film of the present invention.

For example, as conceptually illustrated in FIG. 18, the lower electrode 30 may be patterned such that the lower electrode 30 is smaller than the lower protective layer 32, and the piezoelectric body layer 20 may be provided on the entire surface of the lower protective layer 32.

In this case, even when the upper electrode 24 has the same size as, is larger than, or is smaller than the lower electrode 30, the upper metal foil 16 that is an electrode lead-out portion from the upper electrode 24 does not come into contact with the lower electrode 30, and accordingly, the insulating sheet 14 (the insulating layer) is not necessarily provided. However, in this case, when the upper electrode 24 has the same size as the piezoelectric body layer 20, it is necessary to provide an insulating layer, such as the insulating sheet 14, corresponding to the electrode lead-out portion from the lower electrode 30.

Thus, when both of the electrodes are smaller than the piezoelectric body layer 20, it is not necessary to provide insulating layers for leading out the upper and lower electrodes, regardless of a size relationship between the upper electrode 24 and the lower electrode 30. That is, as illustrated in FIG. 18, when a protective layer in which an electrode is patterned is used, the protective layer can also serve as the insulating layer (or further the above-described tab 62), and thus, it is possible to simplify the work for preparing the electroacoustic converter film of the present invention.

Hereinbefore, the electroacoustic converter film of the present invention has been described in detail, but the present invention is not limited to the above-described examples. Needless to say, the present invention may be improved or modified in various ways within a scope that does not depart from the gist of the present invention.

For example, in the above-described examples, the converter film has a rectangular shape, but a variety of shapes such as circular, elliptical, and polygonal shapes, as well as the rectangular shape, can be used in the converter film of the present invention.

What is claimed is:

1. An electroacoustic converter film, comprising:
a piezoelectric laminate composed of a polymeric composite piezoelectric body in which piezoelectric body particles are dispersed in a viscoelastic matrix formed of a polymer material that exhibits viscoelasticity at normal temperature, an upper thin film electrode formed on one surface of the polymeric composite piezoelectric body and having an area equal to or smaller than that of the polymeric composite piezoelectric body, an upper protective layer formed on a surface of the upper thin film electrode and having an area equal to or greater than that of the upper thin film electrode, a lower thin film electrode formed on a surface of the polymeric composite piezoelectric body opposite to the upper thin film electrode and having an area equal to or smaller than the polymeric composite piezoelectric body, and a lower protective layer formed on a surface of the lower thin film electrode and having an area equal to or greater than that of the lower thin film electrode;
a lead-out metal foil for upper electrode which is laminated on a portion of the upper thin film electrode, and of which at least a portion is located on an outside of the polymeric composite piezoelectric body in a surface direction; and
a lead-out metal foil for lower electrode which is laminated on a portion of the lower thin film electrode, and of which at least a portion is located on an outside of the polymeric composite piezoelectric body in a surface direction,
wherein the electroacoustic converter film includes an insulating layer which is provided between the upper thin film electrode or further the lead-out metal foil for upper electrode and the polymeric composite piezoelectric body, and of which a portion protrudes from an end portion of the polymeric composite piezoelectric body in a surface direction.

2. The electroacoustic converter film according to claim 1, wherein the polymeric composite piezoelectric body has a concave portion formed by making a notch into an outer circumference of the polymeric composite piezoelectric body, and the lead-out metal foil for lower electrode is laminated on the lower thin film electrode such that the lead-out metal foil for lower electrode reaches the inside of the concave portion.

3. The electroacoustic converter film according to claim 1, wherein a glass transition temperature of the polymer material at a frequency of 1 Hz is 0° C. to 50° C.

4. The electroacoustic converter film according to claim 1, wherein the maximum value of loss tangent (Tan δ) at a frequency of 1 Hz of the polymer material, that is 0.5 or higher and is obtained by dynamic viscoelasticity measurement, is present in a temperature range of 0° C. to 50° C.

5. The electroacoustic converter film according to claim 1, wherein the polymer material is at least one of cyanoethylated polyvinyl alcohol, polyvinyl acetate, polyvinylidene chloride co-acrylonitrile, a polystyrene-vinyl polyisoprene block copolymer, polyvinyl methyl ketone, and polybutyl methacrylate.

6. An electroacoustic converter film, comprising:
a piezoelectric laminate composed of a polymeric composite piezoelectric body in which piezoelectric body particles are dispersed in a viscoelastic matrix formed of a polymer material that exhibits viscoelasticity at normal temperature, an upper thin film electrode formed on one surface of the polymeric composite piezoelectric body and having an area equal to or smaller than that of the polymeric composite piezoelectric body, an upper protective layer formed on a surface of the upper thin film electrode and having an area equal to or greater than that of the upper thin film electrode, a lower thin film electrode formed on a surface of the polymeric composite piezoelectric body opposite to the upper thin film electrode and having an area equal to or smaller than the polymeric composite piezoelectric body, and a lower protective layer formed on a surface of the lower thin film electrode and having an area equal to or greater than that of the lower thin film electrode;
a lead-out metal foil for upper electrode which is laminated on a portion of the upper thin film electrode, and of which at least a portion is located on an outside of the polymeric composite piezoelectric body in a surface direction; and
a lead-out metal foil for lower electrode which is laminated on a portion of the lower thin film electrode, and of which at least a portion is located on an outside of the polymeric composite piezoelectric body in a surface direction,
wherein the upper thin film electrode and the upper protective layer have the same shape, and the polymeric composite piezoelectric body and the lower thin film electrode or further the lower protective layer have the same shape, and
the upper thin film electrode is smaller than the lower thin film electrode.

7. An electroacoustic converter film, comprising:
a piezoelectric laminate composed of a polymeric composite piezoelectric body in which piezoelectric body particles are dispersed in a viscoelastic matrix formed of a polymer material that exhibits viscoelasticity at normal temperature, an upper thin film electrode formed on one surface of the polymeric composite piezoelectric body and having an area equal to or smaller than that of the polymeric composite piezoelectric body, an upper protective layer formed on a surface of the upper thin film electrode and having an area equal to or greater than that of the upper thin film electrode, a lower thin film electrode formed on a surface of the polymeric composite piezoelectric body opposite to the upper thin film electrode and having an area equal to or smaller than the polymeric composite piezoelectric body, and a lower protective layer formed on a surface of the tower thin film electrode and having an area equal to or greater than that of the lower thin film electrode;
a lead-out metal foil for upper electrode which is laminated on a portion of the upper thin film electrode, and of which at least a portion is located on an outside of the polymeric composite piezoelectric body in a surface direction; and
a lead-out metal foil for lower electrode which is laminated on a portion of the lower thin film electrode, and of which at least a portion is located on an outside of the polymeric composite piezoelectric body in a surface direction,
wherein the upper thin film electrode and the upper protective layer have an upper electrode lead-out portion that convexly protrudes, and the lead-out metal foil for upper electrode is laminated on the upper thin film electrode of the upper electrode lead-out portion, or further
the lower thin film electrode and the lower protective layer have a lower electrode lead-out portion that convexly protrudes, and the lead-out metal foil for lower electrode is laminated on the lower thin film electrode of the lower electrode lead-out portion.

8. The electroacoustic converter film according to claim 7, wherein a portion of the lead-out metal foil for upper electrode is disposed between the insulating layer and the upper electrode lead-out portion.

9. The electroacoustic converter film according to claim 7, wherein the electroacoustic converter film has either one or both of a configuration in which the lead-out metal foil for upper electrode is folded back so as to sandwich the upper electrode lead-out portion therebetween, and a configuration in which the lead-out metal foil for lower electrode is folded back so as to sandwich the lower electrode lead-out portion therebetween.

10. An electroacoustic converter film, comprising:
a piezoelectric laminate coin used of a polymeric composite piezoelectric body in which piezoelectric body particles are dispersed in a viscoelastic matrix formed of a polymer material that exhibits viscoelasticity at normal temperature, an upper thin film electrode formed on one surface of the polymeric composite piezoelectric body and having an area equal to or smaller than that of the polymeric composite piezoelectric body, an upper protective layer formed on a surface of the upper thin film electrode and having an area equal to or greater than that of the upper thin film electrode, a lower thin film electrode formed on a surface of the polymeric composite piezoelectric body opposite to the upper thin film electrode and having an area equal to or smaller than the polymeric composite piezoelectric body and a lower protective layer formed on a surface of the lower thin film electrode and having an area equal to or greater than that of the lower thin film electrode;
a lead-out metal foil for upper electrode which is laminated on a portion of the upper thin film electrode, and of which at least a portion is located on an outside of the polymeric composite piezoelectric body in a surface direction; and
a lead-out metal foil for lower electrode which is laminated on a portion of the lower thin film electrode, and of which at least a portion is located on an outside of the polymeric composite piezoelectric body in a surface direction, wherein the electroacoustic converter film includes a second upper protective layer formed on a surface of the upper protective layer, or further a second lower protective layer formed on a surface of the lower protective layer.

11. The electroacoustic converter film according to claim 10,
wherein the second upper protective layer or further the second lower protective layer extends up to the outside of the piezoelectric laminate.

12. An electroacoustic converter film, comprising:
a piezoelectric laminate composed of a polymeric composite piezoelectric body in which piezoelectric body particles are dispersed in a viscoelastic matrix formed of a polymer material that exhibits viscoelasticity at normal temperature, an upper thin film electrode formed on one surface of the polymeric composite piezoelectric body and having an area equal to or smaller than that of the polymeric composite piezoelectric body, an upper protective layer formed on a surface of the upper thin film electrode and having an area equal to or greater than that of the upper thin film electrode, a lower thin film electrode formed on a surface of the polymeric composite piezoelectric body opposite to the upper thin film electrode and having an area equal to or smaller than the polymeric composite piezoelectric body, and a lower protective layer formed on a surface of the lower thin film electrode and having an area equal to or greater than that of the lower thin film electrode;
a lead-out metal foil for upper electrode which is laminated on a portion of the upper thin film electrode, and of which at least a portion is located on an outside of the polymeric composite piezoelectric body in a surface direction; and
a lead-out metal foil for lower electrode which is laminated on a portion of the lower thin film electrode, and of which at least a portion is located on an outside of the polymeric composite piezoelectric body in a surface direction,
wherein the electroacoustic converter film includes a side surface insulating layer that is an insulating layer which covers an entire outer circumference of an end portion of the upper protective layer and covers an entire surface of the polymeric composite piezoelectric body outward beyond the upper protective layer.

13. The electroacoustic converter film according to claim 12,
wherein at least a portion of the side surface insulating layer extends up to the outside of the piezoelectric laminate.

14. An electroacoustic converter film, comprising
a piezoelectric laminate composed of a polymeric composite piezoelectric body in which piezoelectric body particles are dispersed in a viscoelastic matrix formed of a polymer material that exhibits viscoelasticity at normal temperature, an upper thin film electrode formed on one surface of the polymeric composite piezoelectric body and having an area equal to or smaller than that of the polymeric composite piezoelectric body, an upper protective layer formed on a surface of the upper thin film electrode and having an area equal to or greater than that of the upper thin film electrode, a lower thin film electrode formed on a surface of the polymeric composite piezoelectric body opposite to the upper thin film electrode and having an area equal to or smaller than the polymeric composite piezoelectric body, and a lower protective layer formed on a surface of the lower thin film electrode and having an area equal to or greater than that of the lower thin film electrode;
a lead-out metal foil for upper electrode which is laminated on a portion of the upper thin film electrode, and of which at least a portion is located on an outside of the polymeric composite piezoelectric body in a surface direction; and
a lead-out metal foil for lower electrode which is laminated on a portion of the lower thin film electrode, and of which at least a portion is located on an outside of the polymeric composite piezoelectric body in a surface direction,
wherein the electroacoustic converter film includes a tab portion which is provided at an end portion of the piezoelectric laminate and protrudes to the outside of the piezoelectric laminate.

15. An electroacoustic converter film, comprising:
a piezoelectric laminate composed of a polymeric composite piezoelectric body in which piezoelectric body articles are dispersed in a viscoelastic matrix formed of a polymer material that exhibits viscoelasticity at normal temperature, an upper thin film electrode formed on one surface of the polymeric composite piezoelectric body and having an area equal to or smaller than that of the polymeric composite piezoelectric body, an upper protective layer formed on a surface of the upper thin film electrode and having an area equal to or greater than that of the upper thin film electrode, a lower thin film electrode formed on a surface of the polymeric composite piezoelectric body opposite to the upper thin film electrode and having an area equal to or smaller than the polymeric composite piezoelectric body, and a lower protective layer formed on a surface of the lower thin film electrode and having an area equal to or greater than that of the lower thin film electrode;
a lead-out metal foil for upper electrode which is laminated on a portion of the upper thin film electrode, and of which at least a portion is located on an outside of the polymeric composite piezoelectric body in a surface direction; and
a lead-out metal foil for lower electrode which is laminated on a portion of the lower thin film electrode, and of which at least a portion is located on an outside of the polymeric composite piezoelectric body in a surface direction,
wherein the electroacoustic converter film has either one or both of a configuration in which a through hole is provided in the upper protective layer, and the lead-out metal foil for upper electrode is laminated on the upper thin film electrode through the through hole, and a configuration in which a through hole is provided in the lower protective layer, and the lead-out metal foil for lower electrode is laminated on the lower thin film electrode through the through hole.

16. The electroacoustic converter film according to claim 15,
wherein the electroacoustic converter film has either one or both of a configuration in which an upper auxiliary metal foil is provided between the polymeric composite piezoelectric body and the upper thin film electrode such that a position of the upper auxiliary metal foil corresponds to a position where the through hole of the upper protective layer is formed, and a configuration in which a lower auxiliary metal foil is provided between the polymeric composite piezoelectric body and the lower thin film electrode such that a position of the lower auxiliary metal foil corresponds to a position where the through hole of the lower protective layer is formed.

17. The electroacoustic converter film according to claim 15,
wherein a plurality of through holes are provided for one electrode lead-out portion.

* * * * *